(12) United States Patent
Park et al.

(10) Patent No.: US 12,198,607 B2
(45) Date of Patent: *Jan. 14, 2025

(54) DISPLAY DEVICE

(71) Applicant: Samsung Display Co., LTD., Yongin-si (KR)

(72) Inventors: Jun Hyun Park, Suwon-si (KR); Dong Woo Kim, Yongin-si (KR); An Su Lee, Seoul (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/982,919

(22) Filed: Nov. 8, 2022

(65) Prior Publication Data

US 2023/0065100 A1  Mar. 2, 2023

Related U.S. Application Data

(62) Division of application No. 16/872,941, filed on May 12, 2020, now Pat. No. 11,521,541.

(30) Foreign Application Priority Data

May 13, 2019 (KR) .......................... 10-2019-0055880

(51) Int. Cl.
G09G 3/32 (2016.01)
(52) U.S. Cl.
CPC ....... *G09G 3/32* (2013.01); *G09G 2300/0426* (2013.01); *G09G 2310/027* (2013.01); *G09G 2330/04* (2013.01)

(58) Field of Classification Search
CPC ............. G09G 3/32; G09G 2300/0426; G09G 2310/027; G09G 2330/04; G09G 2300/0819; G09G 2300/0842; G09G 3/3233; G09G 3/3225; H01L 27/124; H10K 59/122; H10K 59/1213; H10K 59/123; H10K 59/124; H10K 59/1315; H10K 50/00; H10K 59/121
(Continued)

(56) References Cited

U.S. PATENT DOCUMENTS

2018/0097016 A1* 4/2018 Yang .................... H01L 27/1259
2018/0114824 A1* 4/2018 Lee ....................... H10K 59/131

FOREIGN PATENT DOCUMENTS

JP 5613817 10/2014
JP 2017-173505 9/2017
(Continued)

*Primary Examiner* — Amare Mengistu
*Assistant Examiner* — Gloryvid Figueroa-Gibson
(74) *Attorney, Agent, or Firm* — KILE PARK REED & HOUTTEMAN PLLC

(57) ABSTRACT

A display device includes a substrate including a display area and a non-display area around the display area; a transistor on the substrate; an insulating layer on the transistor; a power voltage line on the insulating layer and transferring a power voltage; a data line on the insulating layer and transferring a data voltage; and an auxiliary wire between the substrate and the power voltage line in the display area. The auxiliary wire includes a portion overlapping the power voltage line and a portion overlapping the data line in a plan view and is electrically connected to the power voltage line.

10 Claims, 18 Drawing Sheets

(58) Field of Classification Search
USPC .......................................................... 345/214
See application file for complete search history.

(56) References Cited

FOREIGN PATENT DOCUMENTS

| KR | 10-2016-0057587 | 5/2016 |
| KR | 10-2016-0092184 | 8/2016 |
| KR | 10-2018-0066948 | 6/2018 |

* cited by examiner

DISPLAY DEVICE

CROSS-REFERENCE TO RELATED APPLICATION(S)

This is a divisional application based on currently pending U.S. patent application Ser. No. 16/872,941, filed May 12, 2020 (now U.S. Pat. No. 11,521,541), the disclosure of which is incorporated herein by reference in its entirety. U.S. patent application Ser. No. 16/872,941 claims priority to and benefits of Korean Patent Application No. 10-2019-0055880 under 35 U.S.C. § 119, filed in the Korean Intellectual Property Office on May 13, 2019, the entire contents of which are incorporated herein by reference.

BACKGROUND

(a) Technical Field

This disclosure relates to a display device.

(b) Description of the Related Art

A light emitting diode display has widely attracted attention as a display device. A light emitting diode display has a self-emissive characteristic, eliminating the necessity for a light source, unlike a liquid crystal display (LCD) device, and thus the light emitting diode display can be fabricated to be thinner and lighter than that of an LCD display. Further, the light emitting diode display has many favorable characteristics such as low power consumption, high luminance, high response speed, and the like that contribute to high quality.

Generally, a light emitting diode display includes transistors and light emitting elements. The transistors and the light emitting elements may be connected to power voltage lines for transferring a power voltage such as a driving voltage or a common voltage to receive the driving voltage or the common voltage. A level of the power voltage supplied to the display device due to resistance of the power voltage lines and a resulting voltage drop may not be uniform depending on areas of the display device. As a result, display quality such as luminance uniformity may decrease, and power consumption may increase.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of reducing wire resistance and voltage drop.

An embodiment provides a display device including a substrate including a display area and a non-display area around the display area; a transistor disposed on the substrate; an insulating layer disposed on the transistor; a power voltage line disposed on the insulating layer, the power voltage line transferring a power voltage; a data line disposed on the insulating layer, the data line transferring a data voltage; and an auxiliary wire disposed between the substrate and the power voltage line in the display area. The auxiliary wire includes a portion overlapping the power voltage line and a portion overlapping the data line in a plan view, and the auxiliary wire is electrically connected to the power voltage line.

The power voltage line may be a driving voltage line that transfers a driving voltage or a common voltage line that transfers a common voltage.

The driving voltage line may be connected to a source region or a drain region of the transistor through a contact hole formed in the insulating layer, and to the auxiliary wire through another contact hole formed in the insulating layer.

The display device may further include a pixel electrode electrically connected to the transistor, and the auxiliary wire may include a portion overlapping the pixel electrode in the plan view.

The auxiliary wire may include a portion overlapping the driving voltage line and a portion overlapping the common voltage line in the plan view.

The power voltage line may be a driving voltage line connected to the auxiliary wire through a contact hole formed in at least the insulating layer.

The auxiliary wire may be disposed on a same layer as a gate electrode of the transistor.

The display device may further include a connection pattern disposed between the insulating layer and the transistor, the connection pattern may be electrically connected to the power voltage line and a source region or a drain region of the transistor, and the auxiliary wire may be disposed on a same layer as the connection pattern.

The auxiliary wire may be disposed between the substrate and the transistor.

The display device may further include a lower pattern overlapping an active pattern of the transistor, and the auxiliary wire may be disposed on a same layer as the lower pattern.

The lower pattern may be electrically connected to a source region or a drain region of the transistor.

The display device may further include a buffer layer disposed between the transistor and the auxiliary wire, and the buffer layer may be a multilayer including at least two layers.

The power voltage line may be connected to the auxiliary wire through a contact hole formed in the insulating layer and the buffer layer.

An embodiment provides a display device including a substrate including a display area and a non-display area around the display area; a transistor disposed on the substrate; a power voltage line disposed on the transistor, the power voltage line transferring a power voltage; a data line disposed on the transistor, the data line transferring a data voltage; an insulating layer disposed on the power voltage line; an auxiliary wire disposed on the insulating layer in the display area, the auxiliary wire including a portion overlapping the power voltage line and a portion overlapping the data line in a plan view, and the auxiliary wire is connected to the power voltage line through a contact hole formed in the insulating layer; and a pixel electrode disposed on the auxiliary wire, the pixel electrode is electrically connected to the transistor.

The display device may further include a capacitor electrode disposed on a same layer as the power voltage line, the capacitor electrode is electrically connected to the transistor; and a contact member disposed between the capacitor electrode and the pixel electrode, the contact member is connected to the capacitor electrode through a contact hole formed in the insulating layer. The auxiliary wire may be disposed on a same layer as the contact member.

The power voltage line may be a driving voltage line that transfers a driving voltage or a common voltage line that transfers a common voltage.

The display device may further include a first contact member disposed on the common voltage line, the first contact member is connected to the common voltage line through a contact hole formed in the insulating layer; and a common electrode disposed on the first contact member, the common electrode is electrically connected to the first contact member. The auxiliary wire may be disposed on a same layer as the first contact member.

The display device may further include a second contact member disposed between the first contact member and the common electrode, the second contact member is electrically connected to the first contact member and the common electrode.

The auxiliary wire may include a portion overlapping the driving voltage line, and a portion overlapping the common voltage line in the plan view.

The auxiliary wire may include a first portion overlapping the common voltage line and a second portion overlapping the driving voltage line and the pixel electrode in the plan view, and the first portion and the second portion may be separated from each other.

According to the embodiments, it may be possible to reduce the resistance of the wires, for example of the power voltage line such as the driving voltage line and the common voltage line, and the voltage drop of the power voltage transferred through the power voltage line. The display quality may be improved, and a margin of the power voltage may be reduced, thereby reducing the power consumption. It may also be possible to reduce a delay of signals such as data signals.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
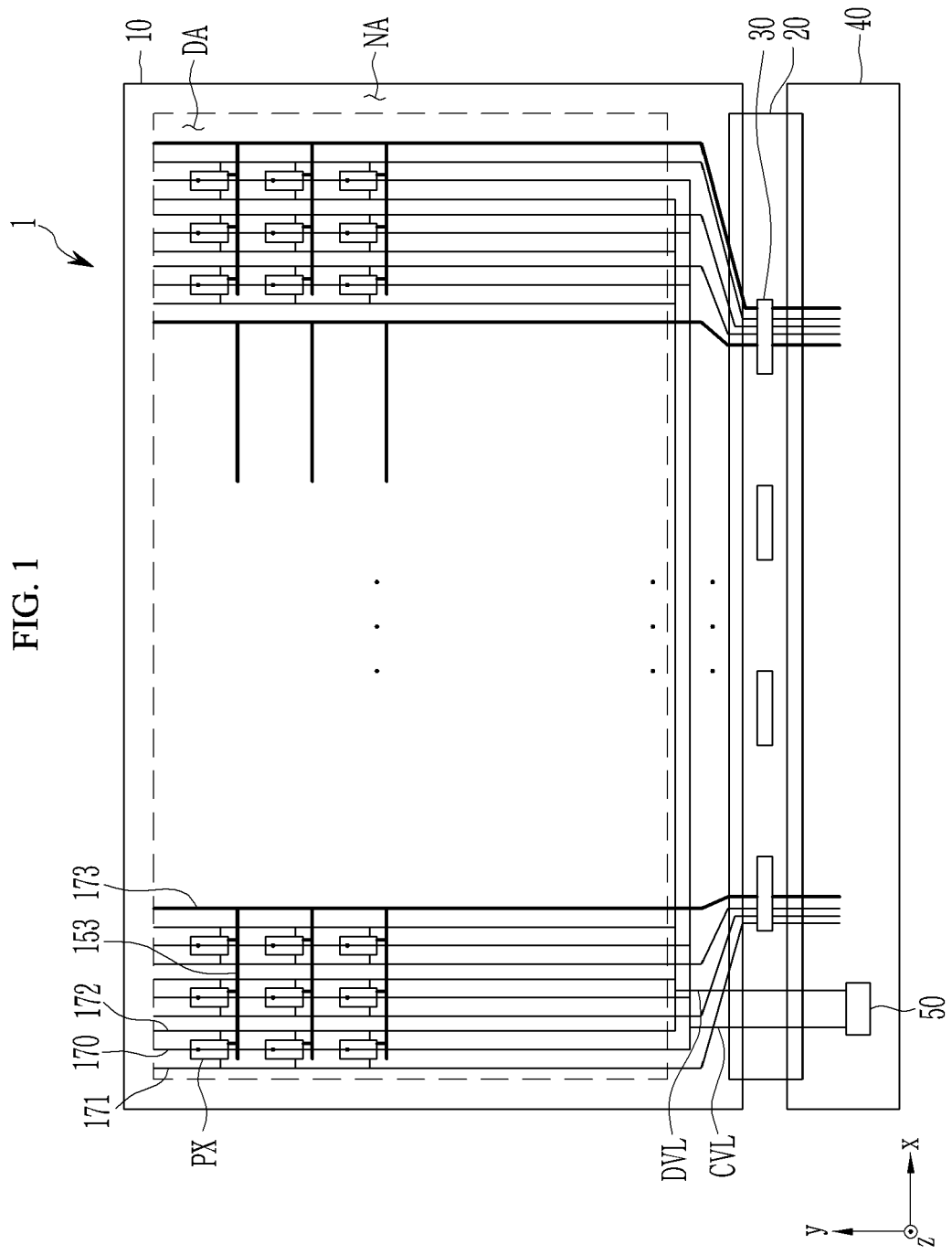
FIG. 1 illustrates a layout view of a display device according to an embodiment.

Embodiments of the invention will be described hereinafter with reference to the accompanying drawings.

Although the invention may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention. Some of the parts which are not associated with the description may not be provided in order to describe embodiments of the invention and like reference numerals refer to like elements throughout the specification.

In the drawings, sizes and thicknesses of elements shown in the accompanying drawings may be enlarged for clarity and ease of description thereof. However, the invention is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other layer, film, region, substrate, or area, or intervening layers, films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification. In the drawings, a reference character x used for indicating a direction is a first direction, y is a second direction perpendicular to the first direction, and z is a third direction perpendicular to the first direction and the second direction. The first direction x, the second direction y, and the third direction z may correspond to a horizontal direction, a vertical direction, and a thickness direction of the display device, respectively. It is to be noted that these first, second, and third directions may be substantially, horizontal, vertical and thickness directions.

Hereinafter, a display device (a light emitting display device as an example) according to embodiments will be described with reference to the drawings.

FIG. 1 illustrates a layout view of a display device 1 according to an embodiment.

The display device 1 may include a display panel 10, a flexible printed circuit film 20, a printed circuit board (PCB) 40, and the like.

The display panel 10 may include a display area DA corresponding to a screen on which an image is displayed and a non-display area NA, and wires and/or circuits for generating and/or transferring various signals and voltages applied to the display area DA may be disposed in the non-display area NA. The non-display area NA may surround the display area DA.

Pixels PX may be disposed in, for example, a matrix form in the display area DA of the display panel 10. A data line 171 for transferring a data signal, a driving voltage line 172 for transferring a driving voltage ELVDD, a common voltage line 170 for transferring a common voltage ELVSS, and an initialization voltage line 173 and a horizontal initialization voltage line 153 for transferring an initialization voltage may be disposed. Each pixel PX may receive the data signal, the driving voltage ELVDD, the common voltage ELVSS, and an initialization voltage from such respective wires. Herein, the driving voltage ELVDD and the common voltage ELVSS are power voltages applied to the respective pixels PX, and the driving voltage line 172 and the common voltage line 170 for transmitting the voltages are referred to as power voltage lines. The driving voltage ELVDD may be a voltage having a higher potential than the common voltage ELVSS.

A gate driver (not illustrated) may be disposed on opposite sides of the display area DA in the non-display area NA of the display panel 10. The pixels PX may receive a scan signal generated by the gate driver and receive a data signal at a predetermined timing.

A driving voltage transfer line DVL connected to the driving voltage line 172 and a common voltage transfer line CVL connected to the common voltage line 170 may be disposed in the non-display area NA of the display panel 10. Each of the driving voltage transfer line DVL and the common voltage transfer line CVL may include a portion extending in a substantially second direction y and a portion extending in a substantially first direction x.

As used herein, the term "portion" may include a part of a whole or part of an area of an element, a section or piece of an element, or a predetermined amount of an element, or any other definition as would be understood and appreciated by those of ordinary skill in the art.

The flexible printed circuit film 20 may have a first end bonded to the display panel 10 and a second end bonded to the printed circuit board 40. A data driver 30 for applying a data voltage to the data line 171 may be disposed in the flexible printed circuit film 20, and may be provided as an integrated circuit chip.

A power module 50 that generates a power voltage such as the driving voltage ELVDD or the common voltage ELVSS may be disposed in the printed circuit board 40. The power module 50 may be provided as an integrated circuit chip. A signal controller for controlling the data driver 30 and the gate driver may be disposed in the printed circuit board 40.

A configuration of the display device according to an embodiment has been described so far. The display device according to an embodiment will now be described in more detail.

Figure 2:
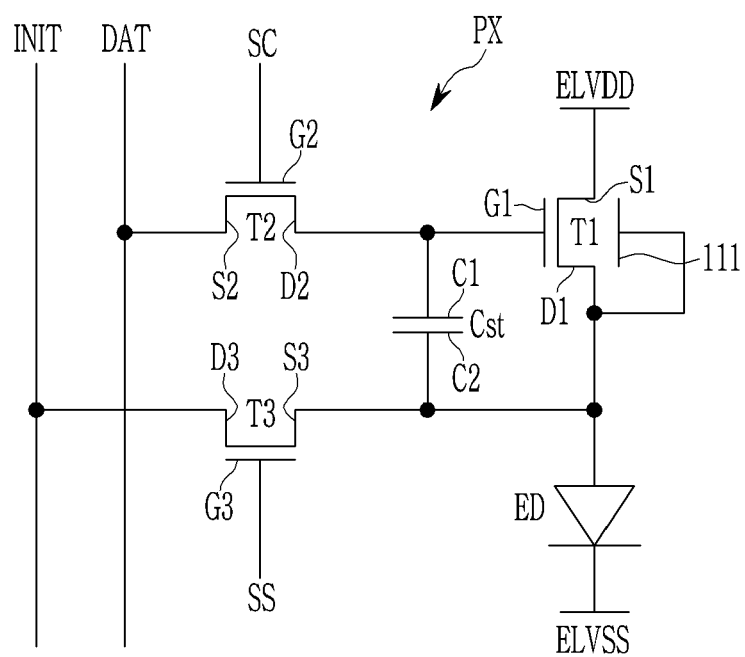
FIG. 2 illustrates a circuit diagram of a pixel of a display device according to an embodiment.

FIG. 2 illustrates a schematic diagram of an equivalent circuit of a pixel of a display device according to an embodiment.

Referring to FIG. 2, one pixel PX may include transistors T1, T2, and T3, a capacitor Cst, and a light emitting diode ED.

The transistors T1, T2, and T3 may include a first transistor T1, a second transistor T2, and a third transistor T3. A source electrode and a drain electrode, which will be described later, are used to distinguish two electrodes disposed on opposite sides of a channel of each of the transistors T1, T2, and T3, and they may be interchanged.

The first transistor T1 may include a gate electrode G1, a source electrode S1, and a drain electrode D1. The gate electrode G1 may be connected to a first electrode C1 of the capacitor Cst, the source electrode S1 may be connected to the driving voltage line for receiving the driving voltage ELVDD, and the drain electrode D1 may be connected to an anode of the light emitting diode ED and a second electrode C2 of the capacitor Cst. The first transistor T1 may receive a data voltage DAT depending on a switching operation of the second transistor T2, may store the data voltage DAT in the capacitor Cst, and may supply a driving current to the light emitting diode ED depending on the stored voltage.

The second transistor T2 may include a gate electrode G2, a source electrode S2, and a drain electrode D2. The gate electrode G2 may be connected to a first scan line for transferring a first scan signal SC, the source electrode S2 may be connected to a data line capable of transmitting the data voltage DAT or a reference voltage, and the drain electrode D2 may be connected to the first electrode C1 of the capacitor Cst and the gate electrode G1. The second transistor T2 may be turned on depending on the first scan signal SC to transfer the reference voltage or the data voltage DAT to the gate electrode G1 and the first electrode C1 of the capacitor Cst.

The third transistor T3 may include a gate electrode G3, a source electrode S3, and a drain electrode D3. The gate electrode G3 may be connected to a second scan line for transferring a second scan signal SS, the source electrode S3 may be connected to the second electrode C2 of the capacitor Cst, the drain electrode D1, and the anode, and the drain electrode D3 may be connected to an initialization voltage line carrying an initialization voltage INIT. The third transistor T3 may be turned on in response to the second scan signal SS to initialize an anode voltage by transferring the initialization voltage INIT to the anode and the second electrode C2 of the capacitor Cst.

The first electrode C1 of the capacitor Cst may be connected to the gate electrode G1 of the first transistor T1, and the second electrode C2 of the capacitor Cst may be connected to the source electrode S3 and the anode. A cathode of the light emitting diode ED may be connected to a common voltage line for transferring the common voltage ELVSS.

The light emitting diode ED may emit light having luminance (gray) depending on a driving current generated by the first transistor T1.

An example of an operation of a circuit illustrated in FIG. 2, for operation during one frame, for example, will be described where the transistors T1, T2, and T3 are all N-type channel transistors as an example.

When one frame is started, the first scan signal SC of a high level and the second scan signal SS of a high level are supplied in the initialization period, and the second transistor T2 and the third transistor T3 are turned on. A reference voltage from the data line is supplied to the gate electrode G1 and the first electrode C1 of the capacitor Cst through the turned-on second transistor T2, and the initialization voltage INIT is supplied to the drain electrode D1 and the anode through the turned-on third transistor T3. During the initialization period, the drain electrode D1 and the anode are initialized to the initialization voltage INIT. A voltage difference between the reference voltage and the initialization voltage INIT is stored in the capacitor Cst.

When the second scan signal SS is changed to a low level in a state where the first scan signal SC of a high level is maintained for a sensing period, the second transistor T2 maintains a turn-on state and the third transistor T3 is turned off. The gate electrode G1 and the first electrode C1 of the capacitor Cst maintain the reference voltage through the turned-on second transistor T2, while the drain electrode D1 and the anode are disconnected from the initialization voltage INIT through the turned-off third transistor T3. The first transistor T1 is turned off when the voltage of the gate electrode G1 becomes "reference voltage—$V_{th}$," while a current flows from the source electrode S1 to the drain electrode D1. $V_{th}$ indicates a threshold voltage of the first transistor T1. A voltage difference between the gate electrode G1 and the drain electrode D1 is stored in the capacitor Cst, and sensing of the threshold voltage $V_{th}$ of the first transistor T1 is completed. A characteristic deviation of the first transistor T1 which may be different for each pixel PX may be compensated by generating a data signal that is compensated by reflecting characteristic information sensed for the sensing period.

The second transistor T2 is turned on and the third transistor T3 is turned off when the first scan signal SC of the high level and a second scan signal SS of a low level are supplied for a data input period. The data voltage DAT from the data line is supplied to the gate electrode G1 and the first electrode C1 of the capacitor Cst through the turned-on second transistor T2. The drain electrode D1 and anode may maintain almost the same potential of the sensing period by the first transistor T1 which is in the turned-off state. The first transistor T1 which is turned on by the data voltage DAT transferred to the gate electrode G1 for a light emitting period generates a driving current depending on the data voltage DAT, and the driving current may allow the light emitting diode ED to emit light.

Hereinafter, a detailed structure of a display device according to an embodiment will be described with reference to FIG. 3 to FIG. 6.

Figure 3:
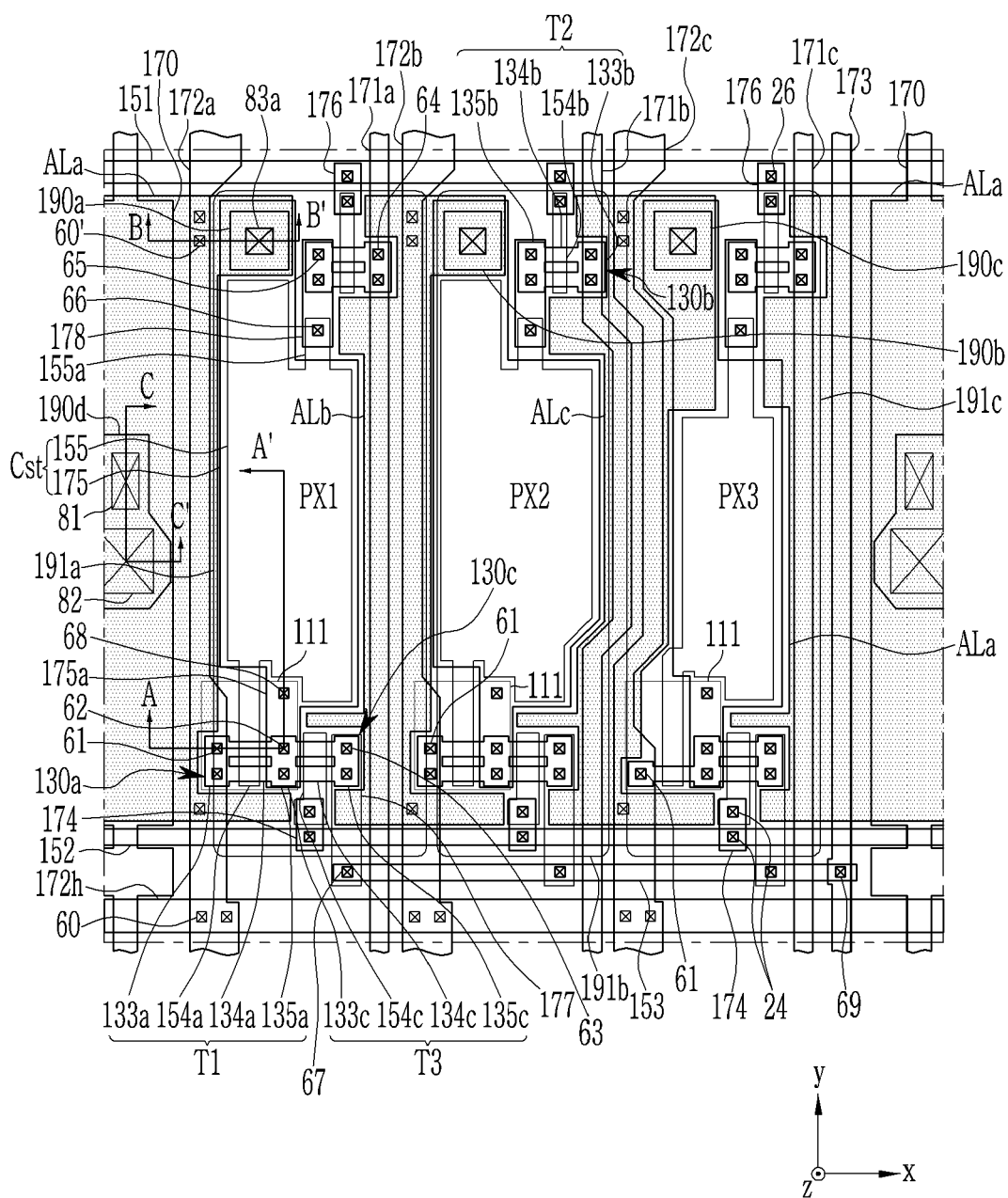
FIG. 3 illustrates a layout view of a pixel area of a display device according to an embodiment.
Figure 4:
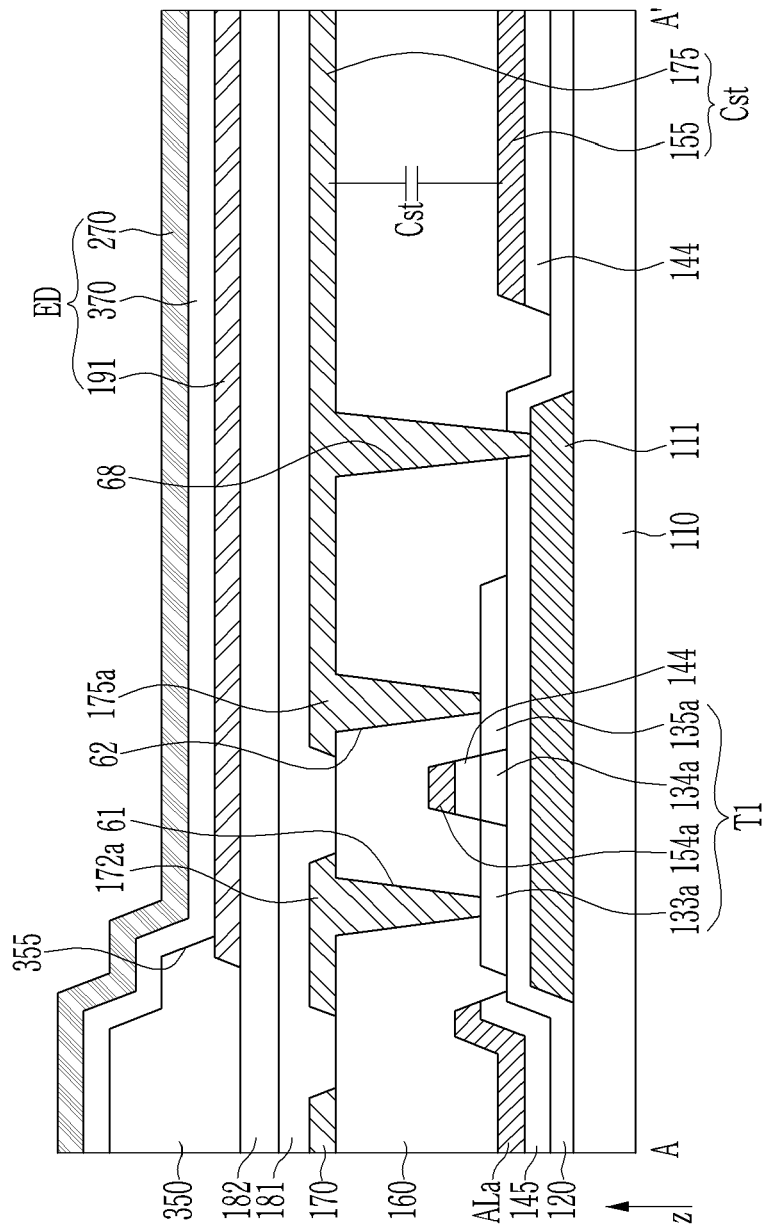
FIG. 4 illustrates a schematic cross-sectional view taken along line A-A' of FIG. 3 according to an embodiment.
Figure 5:
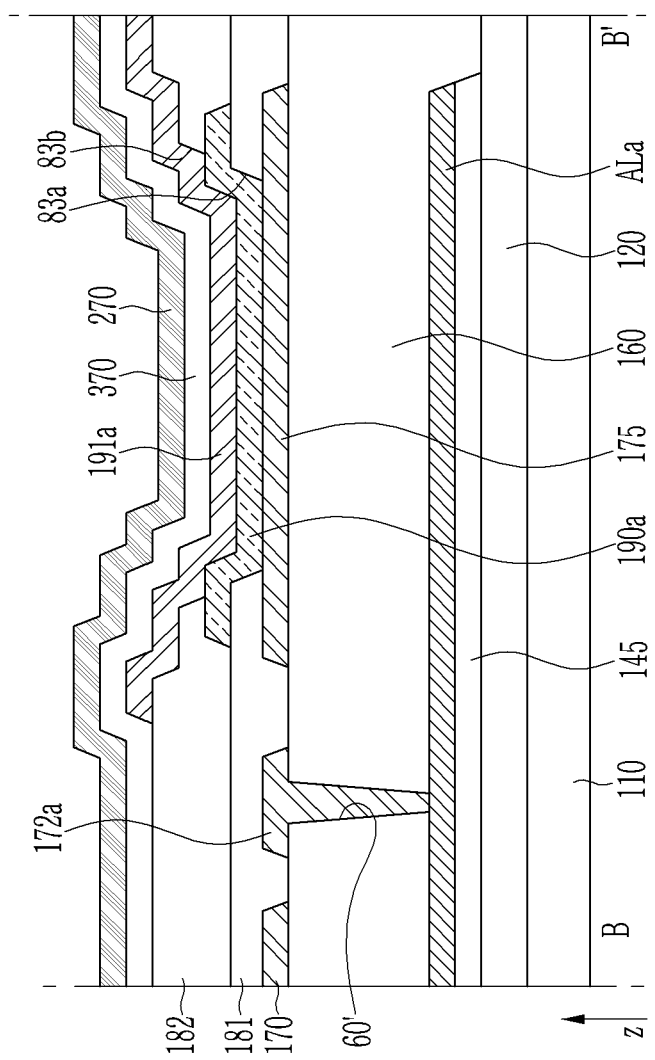
FIG. 5 illustrates a schematic cross-sectional view taken along line B-B' of FIG. 3 according to an embodiment.
Figure 6:
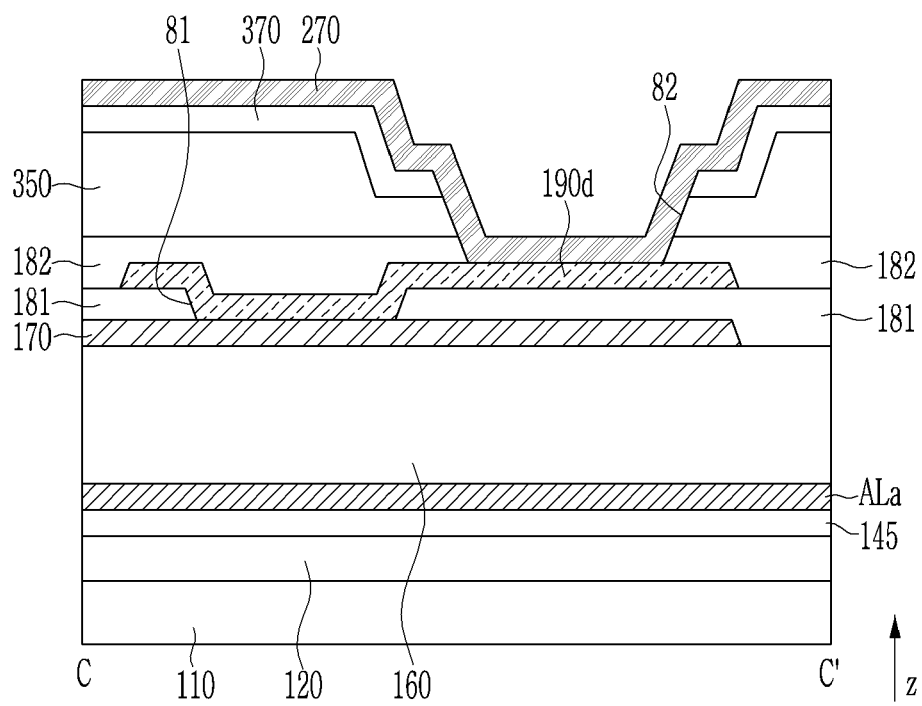
FIG. 6 and FIG. 7 each illustrates a schematic cross-sectional view taken along line C-C' of FIG. 3 according to an embodiment.

FIG. 3 illustrates a layout view of a pixel area of a display device according to an embodiment, FIG. 4 is a schematic cross-sectional view taken along line A-A' of FIG. 3 according to an embodiment, FIG. 5 illustrates a schematic cross-sectional view taken along line B-B' of FIG. 3 according to an embodiment, and FIG. 6 illustrates a schematic cross-sectional view taken along line C-C' of FIG. 3 according to an embodiment. FIG. 3 illustrates a planar structure of three neighboring pixels PX1, PX2, and PX3. Each of the pixels PX1, PX2, and PX3 may include corresponding constituent elements, and thus a reference numeral of a constituent element of one of the pixels PX1, PX2, and PX3 may be similarly applied to the corresponding constituent elements of the remaining pixels.

The display device according to the embodiment includes a substrate 110. The substrate 110 may be made of an insulating material such as glass or plastic or other suitable insulating material.

A first conductive layer including a lower pattern 111 may be disposed on the substrate 110. The lower pattern may also be referred to as a conductive pattern. The first conductive layer may include a conductive material such as a metal or a metal alloy. A thickness of the lower pattern 111 may be in a range of about several hundred angstroms to about several thousand angstroms.

A buffer layer 120, which may be an insulating layer, may be disposed on the first conductive layer. As described later on, the buffer layer 120 may be comprised of a first layer 120a and a second layer 120b. The first layer 120a and/or the second layer 120b may include an organic insulating material or an inorganic insulating material.

An active layer including active patterns 130a, 130b, and 130c may be disposed on the buffer layer 120. The first conductive layer may be disposed between the substrate 110 and the active layer. The active patterns 130a, 130b, and 130c disposed at each of the pixels PX1, PX2, and PX3 may include channel regions 134a, 134b, and 134c that form respective channels of the transistors T1, T2, and T3, and conductive regions connected to the channel regions 134a, 134b, and 134c. The conductive regions of the active patterns 130a, 130b, and 130c may respectively include source regions 133a, 133b, and 133c and drain regions 135a, 135b, and 135c of the transistors T1, T2, and T3.

In each of the pixels PX1, PX2, and PX3, the active pattern 130a and the active pattern 130c may be connected to or separated from each other. FIG. 3 illustrates an example in which the active pattern 130a and the active pattern 130c are connected to each other. The drain region 135a of the active pattern 130a may be the source region 133c of the active pattern 130c.

The active layer may include a semiconductor material such as an oxide semiconductor, polysilicon, and amorphous silicon, for example. A thickness of the active layer may be less than the thickness of the lower pattern 111, and may be about several hundred angstroms.

Insulating patterns 144 and 145, which are first insulating layers, may be disposed on the active layer. The insulating pattern 144 may overlap the channel regions 134a, 134b, and 134c of the active patterns 130a, 130b, and 130c, and may be disposed on the channel regions 134a, 134b, and 134c. The insulating pattern 144 may not substantially overlap the conductive regions of the active patterns 130a, 130b, and 130c. The insulating pattern 145 may overlap auxiliary wires ALa, ALb, and ALc.

The term "overlap" may include layer, stack, face or facing, extending over, covering or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

A second conductive layer may be disposed on the first insulating layer. The second conductive layer may include a first scan line 151 capable of transferring the first scan signal SC described above, a second scan line 152 capable of transferring the second scan signal SS, a horizontal initialization voltage line 153 capable of transferring the initialization voltage INIT, a horizontal driving voltage line 172h capable of transferring the driving voltage ELVDD, a driving gate electrode 155, a second gate electrode 154b, a third gate electrode 154c, and auxiliary wires ALa, ALb, and ALc. In FIG. 3, shaded areas correspond to regions where the auxiliary wires ALa, ALb, and ALc may be formed. The constituent elements included in the second conductive layer may be formed in a same layer by using a same process. Thus, manufacturing costs may be reduced. The gate electrode G1, the gate electrode G2, and the gate electrode G3 in the circuit diagram of FIG. 2 may correspond to a first gate electrode 154a included in the driving gate electrode 155, the second gate electrode 154b, and the third gate electrode 154c.

Each of the first scan line 151, the second scan line 152, the horizontal initialization voltage line 153, and the horizontal driving voltage line 172h may extend in a substantially first direction x.

The driving gate electrode 155 may be disposed between the first scan line 151 and the second scan line 152.

The second gate electrode 154b may be spaced apart from the first scan line 151, and may extend substantially in a second direction y. The second gate electrode 154b may be directly connected to the first scan line 151.

The third gate electrode 154c may be spaced apart from the second scan line 152, and may extend substantially in the second direction y. The third gate electrode 154c may be directly connected to the second scan line 152.

The driving gate electrode 155 disposed in each of the pixels PX1, PX2, and PX3 may include a protrusion 155a that protrudes upward, and the first gate electrode 154a that protrudes downward and substantially extends in the second direction y.

The first gate electrode 154a crosses the active pattern 130a, and overlaps the channel region 134a of the active pattern 130a. The second gate electrode 154b crosses the active pattern 130b, and overlaps the channel region 134b of the active pattern 130b. The third gate electrode 154c crosses the active pattern 130c, and overlaps the channel region 134c of the active pattern 130c.

The auxiliary wires ALa, ALb, and ALc may be disposed at regions at which constituent elements other than the auxiliary wires ALa, ALb, and ALc, that is, the first scan line 151, the second scan line 152, the horizontal initialization voltage line 153, the horizontal driving voltage line 172h, the driving gate electrode 155, the second gate electrode 154b, and the third gate electrode 154c, in the second conductive layer, are not formed. The auxiliary wires ALa, ALb, and ALc may be electrically connected to the power voltage lines such as driving voltage lines 172a, 172b, and 172c and the common voltage line 170, thereby reducing resistance of the power voltage lines.

Each of the auxiliary wires ALa, ALb, and ALc may extend substantially in the second direction y. Each of the auxiliary wires ALa, ALb, and ALc may include a portion overlapping pixel electrodes 191a, 191b, and 191c in the pixels PX1, PX2, and PX3. Each of the auxiliary wires ALa, ALb, and ALc may include a portion overlapping the driving voltage lines 172a, 172b and 172c, the common voltage line 170, and/or data lines 171a, 171b and 171c. In the embodiment illustrated therein, the auxiliary wire ALa overlaps the driving voltage line 172a and the common voltage line 170, the auxiliary wire ALb overlaps the driving voltage line 172b and the data line 171a, and the auxiliary wire ALc overlaps the driving voltage line 172c and the data line 171b. The auxiliary wires ALa, ALb, and ALc may not overlap the active patterns 130a, 130b, and 130c.

A second insulating layer 160 may be disposed on the second conductive layer. The second insulating layer 160 may cover the transistors T1, T2, and T3. The buffer layer 120 and/or the second insulating layer 160 may include contact holes 24, 26, 60, 61, 62, 63, 64, 65, 66, 67, 68, 69, and 60'. As will be described later on, the second insulating layer 160 may be formed of multiple layers including at least a first layer 160a and a second layer 160b, and the first layer 160a and/or the second layer 160b may include an organic insulating material or an inorganic insulating material.

A third conductive layer may be disposed on the second insulating layer 160. The third conductive layer may include the data lines 171a, 171b, and 171c, the driving voltage lines 172a, 172b, and 172c, the common voltage line 170, the initialization voltage line 173, a capacitor electrode 175, and connecting members 174, 176, 177, and 178.

Each of the data lines 171*a*, 171*b*, and 171*c*, the driving voltage lines 172*a*, 172*b*, and 172*c*, the common voltage line 170, and the initialization voltage line 173 may extend substantially in the second direction y, and may cross the first scan line 151 and the second scan line 152.

A group of pixels PX1, PX2, and PX3 illustrated in FIG. 3 may be arranged in the first direction x to be substantially adjacent to each other, and may be repeatedly arranged in the first direction x and the second direction y. The common voltage line 170 may be disposed at left and right sides of the pixels PX1, PX2, and PX3 of one group, for example. When three pixels PX1, PX2, and PX3 are repeatedly contained in one group, the three data lines 171*a*, 171*b*, and 171*c*, the three driving voltage lines 172*a*, 172*b*, and 172*c*, and at least one initialization voltage line 173 may be disposed between two common voltage lines 170 that may be substantially adjacent in the first direction x.

Each of the data lines 171*a*, 171*b*, and 171*c* may be connected to the source region 133*b* of the active pattern 130*b* through the contact hole 64 of the second insulating layer 160.

The driving voltage lines 172*a*, 172*b*, and 172*c* may be respectively disposed in the pixels PX1, PX2, and PX3. Each of the driving voltage lines 172*a*, 172*b*, and 172*c* may extend substantially in the second direction y.

The driving voltage lines 172*a*, 172*b*, and 172*c* may be connected to the source region 133*a* of the active pattern 130*a* through the contact hole 61 of the second insulating layer 160. The driving voltage lines 172*a*, 172*b*, and 172*c* may be connected to the horizontal driving voltage line 172*h* through the contact hole 60 of the second insulating layer 160. The horizontal driving voltage line 172*h* may transfer the driving voltage together with the driving voltage lines 172*a*, 172*b*, and 172*c*. The horizontal driving voltage line 172*h* and the driving voltage lines 172*a*, 172*b*, and 172*c* may be connected in a mesh form throughout the display device.

The driving voltage lines 172*a*, 172*b*, and 172*c* may be connected to respective auxiliary wires ALa, ALb, and ALc through contact holes 60' of the second insulating layer 160. In other words, each of the driving voltage lines 172*a*, 172*b*, and 172*c* may be connected to a corresponding one of the auxiliary wires ALa, ALb, and ALc through a corresponding one of the contact holes 60' of the second insulating layer 160. For example, FIG. 5 illustrates the driving voltage line 172*a* connected to the auxiliary wire ALa through the contact hole 60' of the second insulating layer 160. The resistance of the driving voltage lines 172*a*, 172*b*, and 172*c* may be reduced, and a voltage drop of the driving voltage ELVDD transferred through the driving voltage lines 172*a*, 172*b*, and 172*c* may be reduced. The auxiliary wire ALa may overlap the common voltage line 170 as shown, but may not overlap the common voltage line 170. The common voltage line 170 may be connected to the auxiliary wire ALa through a contact hole formed in the second insulating layer 160.

The initialization voltage line 173 may be connected to the horizontal initialization voltage line 153 through the contact hole 69 of the second insulating layer 160. The horizontal initialization voltage line 153 may transfer the initialization voltage together with the initialization voltage line 173. The initialization voltage may be transferred to all three pixels PX1, PX2, and PX3 through the horizontal initialization voltage line 153 even when one initialization voltage line 173 is disposed for every three pixels PX1, PX2, and PX3. The three pixels PX1, PX2, and PX3 may receive the initialization voltage simultaneously through the horizontal initialization voltage line 153, and may constitute one pixel group.

One capacitor electrode 175 may be disposed for the pixels PX1, PX2, and PX3. The capacitor electrode 175 may overlap the corresponding driving gate electrode 155 with the second insulating layer 160 therebetween to form the capacitor Cst. The first electrode C1 and the second electrode C2 of the capacitor Cst of FIG. 2 may correspond to the driving gate electrode 155 and the capacitor electrode 175, respectively.

The capacitor electrode 175 may include a protrusion 175*a* extending downward. The protrusion 175*a* may be connected to the drain region 135*a* of the active pattern 130*a* as illustrated in FIG. 4 for example or the source region 133*c* of the active pattern 130*c* through the contact hole 62 of the second insulating layer 160. The capacitor electrode 175 may be connected to the lower pattern 111 through the contact hole 68 of the buffer layer 120 and the second insulating layer 160 as illustrated for example in FIG. 4. The lower pattern 111 may be electrically connected to the drain region 135*a* or the source region 133*c*.

The connecting member 174 may be electrically connected to the second scan line 152 and the third gate electrode 154*c* through the contact hole 24 of the second insulating layer 160 to electrically connect the second scan line 152 and the third gate electrode 154*c*.

The connecting member 176 may be electrically connected to the first scan line 151 and the second gate electrode 154*b* through the contact hole 26 of the second insulating layer 160 to electrically connect the first scan line 151 and the second gate electrode 154*b*.

The connecting member 177 may be connected to the drain region 135*c* of the active pattern 130*c* through the contact hole 63 of the second insulating layer 160 in each of the pixels PX1, PX2, and PX3, to be connected to be the horizontal initialization voltage line 153 through the contact hole 67 of the second insulating layer 160. The drain region 135*c* of the active pattern 130*c* may be electrically connected to the horizontal initialization voltage line 153.

The horizontal initialization voltage line 153 may extend substantially in the first direction x across three pixels PX1, PX2, and PX3. The horizontal initialization voltage line 153 may be disposed between two adjacent common voltage lines 170, and may not intersect the two common voltage lines 170. The horizontal initialization voltage line 153 may intersect the three neighboring data lines 171*a*, 171*b*, and 171*c*, and may extend to the initialization voltage line 173. As another example, the horizontal initialization voltage line 153 may intersect the three neighboring data lines 171*a*, 171*b*, and 171*c*, and may extend to only the initialization voltage line 173.

The connecting member 178 may be connected to the drain region 135*b* of the active pattern 130*b* through the contact hole 65 of the second insulating layer 160 in each of the pixels PX1, PX2, and PX3, and may be connected to be the protrusion 155*a* of the driving gate electrode 155 through the contact hole 66 of the second insulating layer 160. The connecting member 178 may electrically connect the drain region 135*b* of the active pattern 130*b* and the protrusion 155*a* of the driving gate electrode 155.

Each of the first conductive layer, the second conductive layer, and the third conductive layer may include a metal such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), or tantalum (Ta), or an alloy thereof. Each of the first conductive layer, the second conductive layer, and the third conductive layer may have a single layer or multilayer structure as understood by those of ordinary skill in the art.

The first transistor T1 includes the channel region 134a, the source region 133a, the drain region 135a, and the first gate electrode 154a. Since the source region 133a of the first transistor T1 is electrically connected to the driving voltage lines 172a, 172b, and 172c, the driving voltage may be applied thereto.

As illustrated for example in FIG. 4, the lower pattern 111 corresponding to the first transistor T1 may be formed to overlap the channel region 134a of the first transistor T1 between the channel region 134a and the substrate 110, to block external light from entering the channel region 134a, thereby reducing a leakage current of the first transistor T1 and characteristic deterioration. The lower pattern 111 may be electrically connected to the drain region 135a of the first transistor T1 through the capacitor electrode 175.

The lower pattern 111 may entirely overlap the active pattern 130a, and may overlap all of the source region 133a, the channel region 134a, and the drain region 135a of the first transistor T1 as illustrated in FIG. 4 for example. A region where the active pattern 130a is formed may be positioned in a region where the lower pattern 111 is formed. Since the active pattern 130a does not intersect an edge of the lower pattern 111, defects such as disconnection of the active pattern 130a near the edge of the lower pattern 111, which may be thicker than the active pattern 130a and may form a relatively large step, as would be understood and appreciated by one of ordinary skill in the art, may be prevented. It may be possible to improve layout disposing efficiency in the vicinity of the lower pattern 111 and the active pattern 130a.

The lower pattern 111 may be electrically connected to the pixel electrodes 191a, 191b, and 191c through the capacitor electrode 175 to overlap the channel region 134a of the first transistor T1, and thus a current change rate of a saturation region in a voltage-current characteristic graph may be lowered to widen a range of a region where an output current of the first transistor T1 may be constant. Even when a source-drain voltage $V_{ds}$ of the first transistor T1 may be varied, an output current of the first transistor T1 may be constant, thereby improving an output saturation characteristic. A luminance deviation between the pixels depending on the output current of the first transistor T1 may be reduced, thereby improving the image quality.

The second transistor T2 includes the channel region 134b, the source region 133b, the drain region 135b, and the second gate electrode 154b. The source region 133b of the second transistor T2 may be electrically connected to the data lines 171a, 171b, and 171c to receive the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive the initialization voltage from the horizontal initialization voltage line 153.

A third insulating layer 181 may be disposed on the second insulating layer 160 and the third conductive layer. The third insulating layer 181 may include a contact hole 83a overlapping the capacitor electrode 175 as illustrated for example in FIG. 5 and a contact hole 81 overlapping the common voltage line 170 as illustrated in FIG. 3.

A fourth conductive layer including contact members 190a, 190b, 190c, and 190d may be disposed on the third insulating layer 181.

The contact members 190a, 190b, and 190c may be respectively disposed in the pixels PX1, PX2, and PX3, and may be in contact with and electrically connected to the capacitor electrode 175 through the contact hole 83a.

As illustrated in FIG. 6, for example, contact member 190d may be in contact with and electrically connected to the common voltage line 170 through the contact hole 81.

The contact members 190a, 190b, 190c, and 190d may improve adherence between the capacitor electrode 175 of the third conductive layer and the common voltage line 170 and other conductive layers, and may prevent oxidation of the third conductive layer. For example, when an upper layer of the third conductive layer contains copper, oxidation of the copper may be prevented. The fourth conductive layer may contain a conductive material that may be capable of preventing corrosion of the upper layer of the third conductive layer. For example, when the upper layer of the third conductive layer contains copper, the fourth conductive layer may contain a conductive material that may prevent copper corrosion by capping the upper layer of the third conductive layer. The fourth conductive layer may include a conductive material such as a metal oxide, for example, indium tin oxide (ITO) or indium zinc oxide (IZO) or other suitable material as would be appreciated and understood by those of ordinary skill in the art.

A fourth insulating layer 182 may be disposed on the third insulating layer 181 and the fourth conductive layer. The fourth insulating layer 182 may be disposed on the contact members 190a, 190b, 190c, and 190d, and may have a contact hole 83b overlapping the contact hole 83a. For example, FIG. 5 illustrates the fourth insulating layer 182 disposed on the contact member 190a and having a contact hole 83b overlapping the contact hole 83a.

At least one of the buffer layer 120, the first insulating layer, the second insulating layer 160, the third insulating layer 181, and the fourth insulating layer 182 may include an inorganic insulating material such as a silicon nitride ($SiN_x$), a silicon oxide ($SiO_x$), and a silicon oxynitride (SiON), and/or an organic insulating material. For example, the fourth insulating layer 182 may include an inorganic insulating material and/or an organic insulating material such as a polyimide, an acrylic-based polymer, a siloxane-based polymer, and the like, and may have a substantially flat upper surface.

A pixel electrode layer 191 including pixel electrodes 191a, 191b, and 191c may be disposed as a fifth conductive layer on the fourth insulating layer 182. The pixel electrodes 191a, 191b, and 191c may be respectively disposed in the corresponding pixels PX1, PX2, and PX3. The pixel electrodes 191a, 191b, and 191c disposed at three pixels PX1, PX2, and PX3 may differ in size and shape. The pixel PX1 may represent red, the pixel PX2 may represent green, and the pixel PX3 may represent blue. The pixels PX1, PX2 and PX3 are not limited to the aforementioned respective colors and may be any one of red, green or blue. The region that emits light from each of the pixels PX1, PX2, and PX3 may be substantially smaller than regions of the pixel electrodes 191a, 191b, and 191c. Each of the pixel electrodes 191a, 191b, and 191c may include a portion overlapping the auxiliary wires ALa, ALb, and ALc.

The pixel electrodes 191a, 191b, and 191c may respectively contact the corresponding contact members 190a, 190b, and 190c through the contact hole 83b of the fourth insulating layer 182, and may be electrically connected to the capacitor electrode 175 through the contact members 190a, 190b, and 190c. Each of the pixel electrodes 191a, 191b, and 191c may be electrically connected to the drain region 135a of the first transistor T1 to receive a voltage from the first transistor T1.

The pixel electrode layer 191 may include a transflective conductive material or a reflective conductive material. The transflective or reflective conductive materials may include any such materials as would be understood and appreciated by those of ordinary skill in the art.

A fifth insulating layer 350 may be disposed on the fourth insulating layer 182. The fifth insulating layer 350 may have an opening 355 disposed on the pixel electrodes 191a, 191b, and 191c. The fifth insulating layer 350 may include an organic insulating material such as a polyacrylic-based resin or a polyimide-based resin.

A light emission layer 370 may be disposed on the fifth insulating layer 350 and the pixel electrode layer 191. The light emission layer 370 may include a portion disposed in the opening 355 of the fifth insulating layer 350 as illustrated for example, in FIG. 4. The light emission layer 370 may include an organic emission material or an inorganic emission material. At least a portion of the fifth insulating layer 350 may not be covered by the light emission layer 370 as illustrated for example in FIG. 4.

The fifth insulating layer 350 and the light emission layer 370 may include a contact hole 82 overlapping the contact member 190d as illustrated for example in FIG. 6.

A common electrode 270 may be disposed on the light emission layer 370. The common electrode 270 may be continuously formed across the pixels PX1, PX2, and PX3. The common electrode 270 may be in contact with the contact member 190d through the contact hole 82 to be electrically connected to the common voltage line 170 to receive the common voltage as illustrated for example in FIG. 6.

The common electrode 270 may include a conductive transparent material.

The pixel electrodes 191a, 191b, and 191c of the respective pixels PX1, PX2, and PX3, the light emission layer 370, and the common electrode 270 together constitute a light emitting diode ED. One of the pixel electrodes 191a, 191b, and 191c, and the common electrode 270, serves as an anode, and the other serves as a cathode.

A sealing substrate (not illustrated) for sealing the light emitting diode ED may be disposed on the common electrode 270, and a color filter (not illustrated) corresponding to each of the pixels PX1, PX2, and PX3 may be disposed in the sealing substrate.

A display device according to an embodiment will be described with reference to FIG. 7 as well as the aforementioned drawings.

Figure 7:
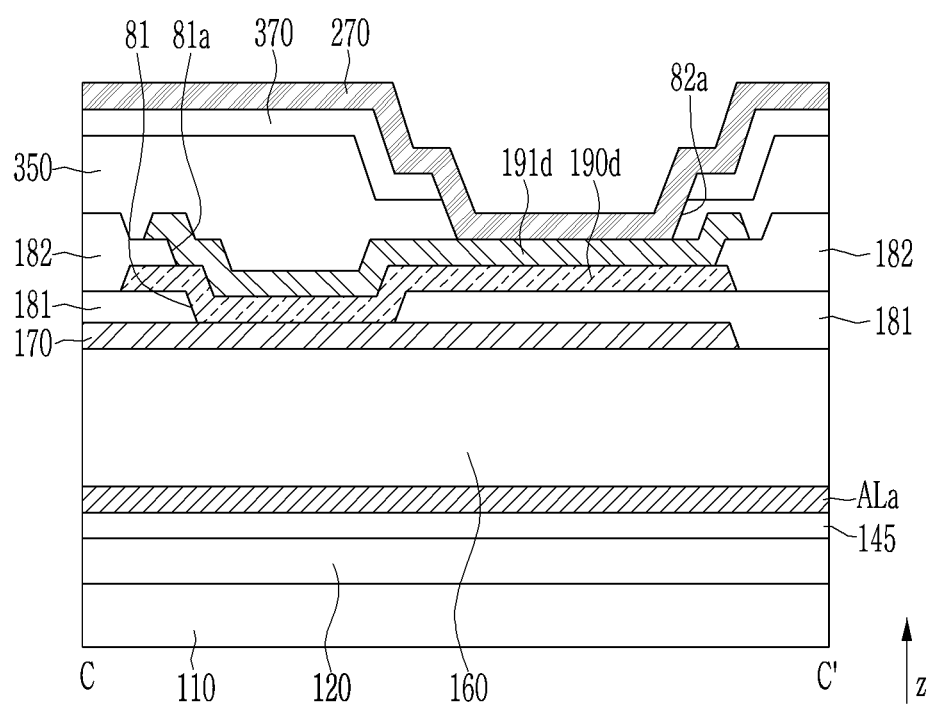

FIG. 7 illustrates a schematic cross-sectional view taken along line C-C' of FIG. 3 according to an embodiment.

The embodiment of FIG. 7 is similar to most of the aforementioned embodiments, except that the fourth insulating layer 182 may include a contact hole 81a positioned on the contact member 190d, and the pixel electrode layer 191 may include a contact member 191d that contacts the contact member 190d through a contact hole 81a. The fifth insulating layer 350 and the light emission layer 370 may include a contact hole 82a overlapping the contact member 191d. The common electrode 270 may be in contact with the contact member 191d through the contact hole 82a to be electrically connected to the common voltage line 170 to receive the common voltage.

A display device according to an embodiment will be described with reference to FIG. 8 and FIG. 9 as well as the aforementioned drawings.

Figure 8:
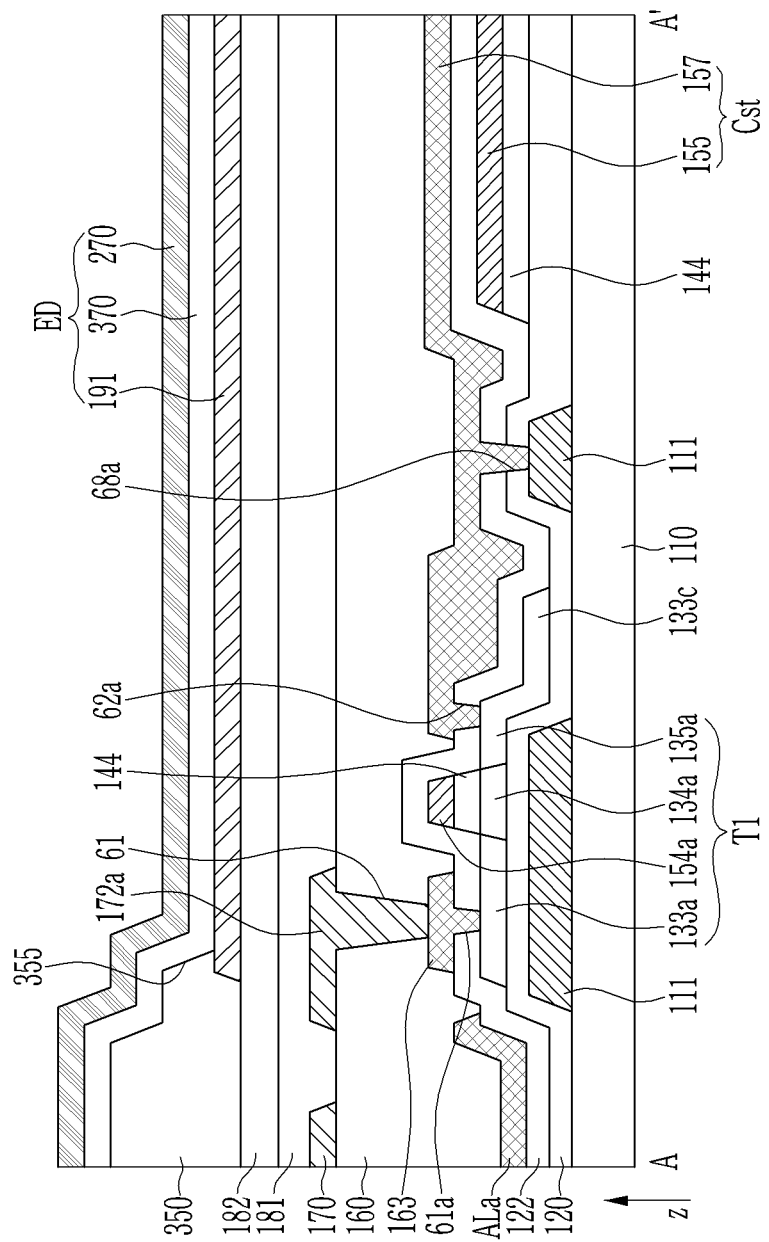
FIG. 8 and FIG. 9 each illustrates a schematic cross-sectional view taken along line A-A' of FIG. 3 according to an embodiment.
Figure 9:
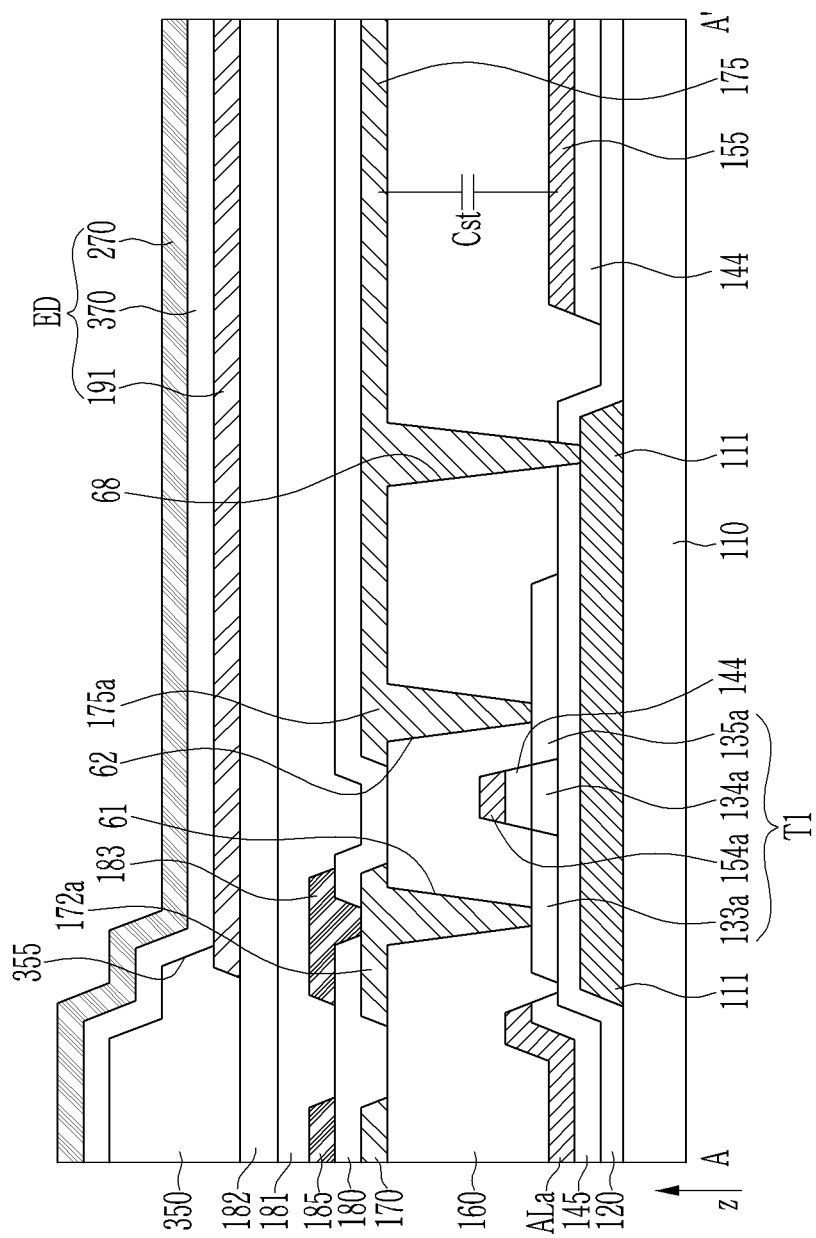

FIG. 8 and FIG. 9 each illustrate a schematic cross-sectional view taken along line A-A' of FIG. 3 according to an embodiment.

The embodiment of FIG. 8 is similar to most of the aforementioned embodiments, except that it may include a sixth insulating layer 122 disposed on the second conductive layer and a sixth conductive layer disposed between the sixth insulating layer 122 and the second insulating layer 160.

The sixth insulating layer 122 may contact the upper surfaces of the conductive regions of the active patterns 130a, 130b, and 130c. The sixth insulating layer 122 may include a contact hole 61a corresponding to and overlapping the contact hole 61 of the second insulating layer 160, and may include contact holes 62a and 68a.

In the embodiment of FIG. 8, a capacitor electrode 157 disposed in the sixth conductive layer may be included instead of the aforementioned capacitor electrode 175. The capacitor electrode 157 may be connected to the lower pattern 111 through the contact hole 68a, and may be connected to the drain region 135a of the active pattern 130a through the contact hole 62a.

The capacitor electrode 157 may have a planar shape similar to that of the capacitor electrode 175 described above. The capacitor electrode 157 may overlap the corresponding driving gate electrode 155 with the sixth insulating layer 122 therebetween to constitute the capacitor Cst.

The sixth conductive layer may include a connection pattern 163. The connection pattern 163 may be in contact with the source region 133a of the active pattern 130a through the contact hole 61a of the sixth insulating layer 122. The driving voltage line 172a may be in contact with and electrically connected to the connection pattern 163 through the contact hole 61 of the second insulating layer 160 to be electrically connected to the source region 133a of the active pattern 130a.

In the embodiment of FIG. 8, the sixth conductive layer may include the auxiliary wires ALa, ALb, and Alc, which may be included in the second conductive layer in the aforementioned embodiment. For example, the auxiliary wires ALa, ALb, and ALc may be disposed at a region where constituent elements other than the auxiliary wires ALa, ALb, and Alc, i.e., the capacitor electrode 157 and the connection pattern 163, are not formed in the sixth conductive layer. At least one of the auxiliary wires ALa, ALb, and ALc may be connected to the connection pattern 163 to be formed continuously with the connection pattern 163. The capacitor electrode 157, the connection pattern 163, and the auxiliary wires ALa, ALb, and ALc, which are constituent elements included in the sixth conductive layer, may be formed in a same layer by using a same process.

The embodiment of FIG. 9 is similar to most of the aforementioned embodiment, except that it may include a seventh insulating layer 180 disposed between the third conductive layer and the third insulating layer 181, and a seventh conductive layer disposed between the seventh insulating layer 180 and the third insulating layer 181.

The seventh conductive layer may include conductive patterns that extend in parallel with the data lines 171a, 171b, and 171c, the driving voltage lines 172a, 172b, and 172c, the common voltage line 170, the initialization voltage line 173, and the like of the third conductive layer, to be electrically connected thereto. For example, the seventh conductive layer may include a conductive pattern 183 and a conductive pattern 185 electrically connected to the driving voltage line 172a and the common voltage line 170 through the contact holes of the seventh insulating layer 180, respectively. The conductive patterns 183 and 185 may transfer a same voltage as that of the constituent elements of the third conductive layer connected thereto, to thereby reduce the voltage drop.

When the display device includes the seventh conductive layer, the third conductive layer may include some of the data lines 171a, 171b, and 171c, the driving voltage lines 172a, 172b, and 172c, the common voltage line 170, the initialization voltage line 173, the capacitor electrode 175, and the connecting members 174, 176, 177, and 178, which may be included in the third conductive layer in the aforementioned embodiment, and the seventh conductive layer may include the other aforementioned elements, for example the conductive patterns 183 and 185.

Hereinafter, the display device according to some embodiments will be described mainly regarding differences from the above-described embodiment.

Figure 10:
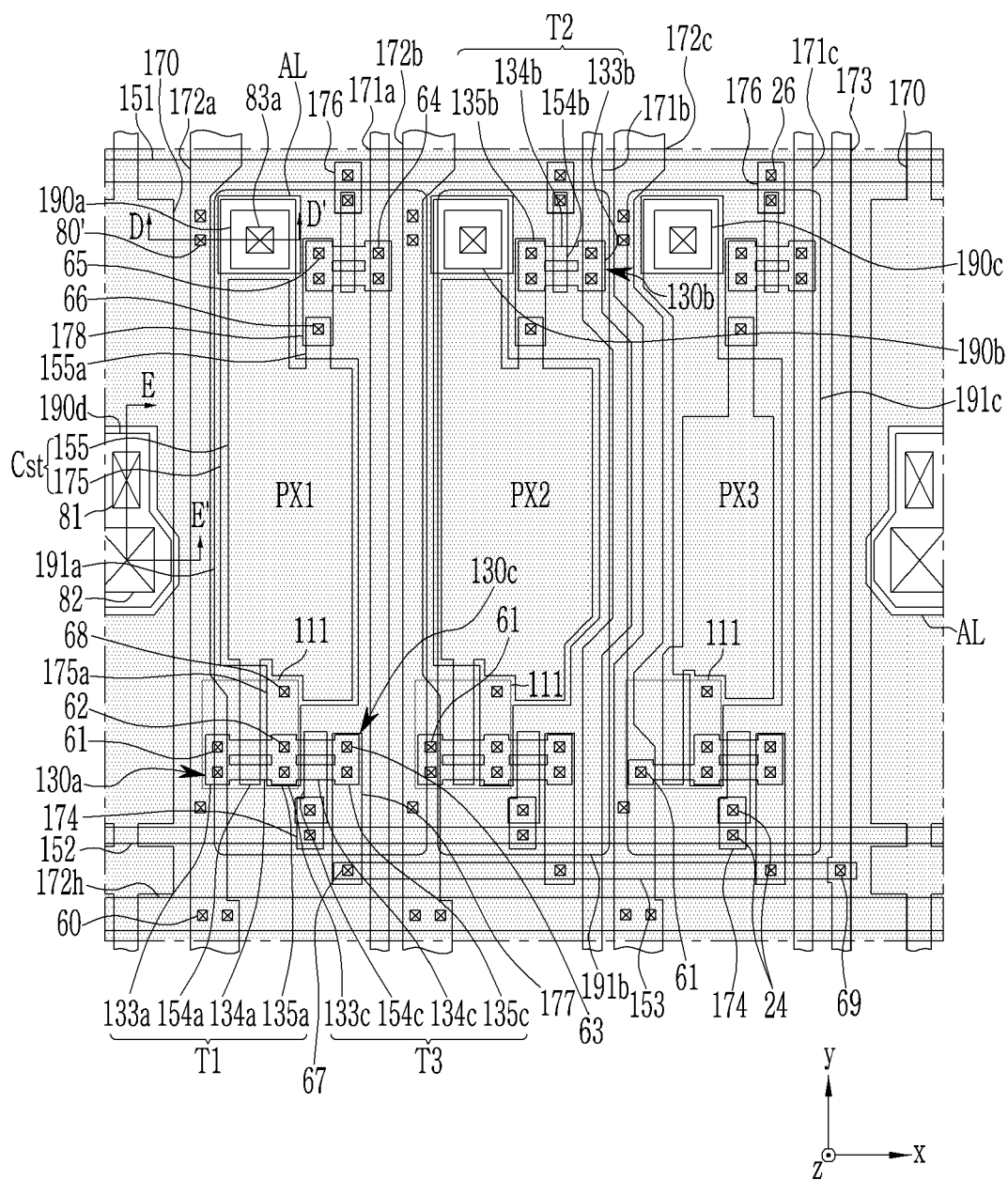
FIG. 10 illustrates a layout view of a pixel area of a display device according to an embodiment.
Figure 11:
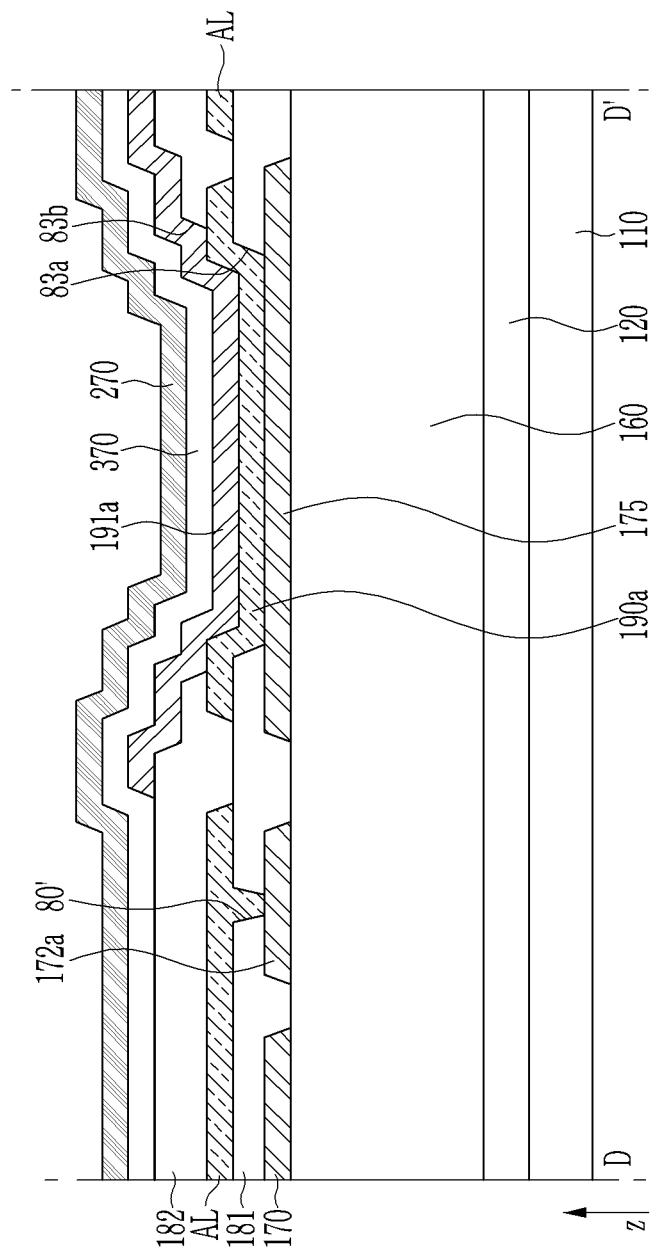
FIG. 11 illustrates a schematic cross-sectional view taken along line D-D' of FIG. 10 according to an embodiment.
Figure 12:
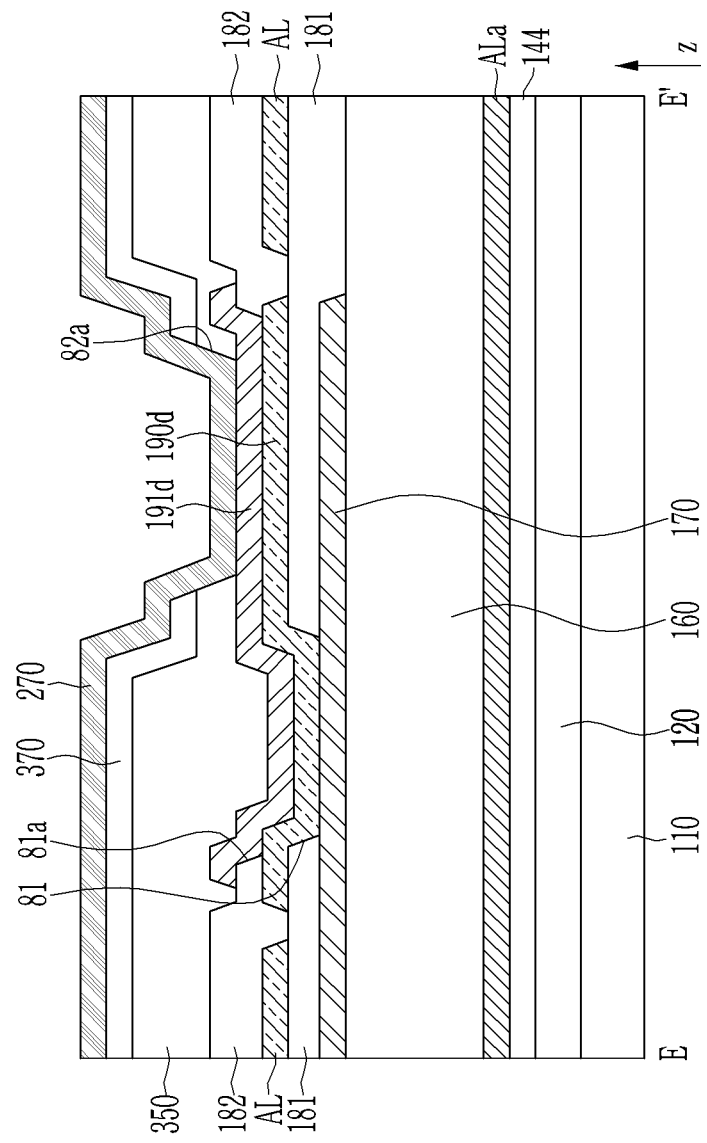
FIG. 12 illustrates a schematic cross-sectional view taken along line E-E' of FIG. 10 according to an embodiment.

FIG. 10 illustrates a layout view of a pixel area of a display device according to an embodiment, FIG. 11 illustrates a schematic cross-sectional view taken along line D-D' of FIG. 10 according to an embodiment, and FIG. 12 illustrates a schematic cross-sectional view taken along line E-E' of FIG. 10 according to an embodiment.

Referring to FIG. 10, FIG. 11, and FIG. 12, the fourth conductive layer may include an auxiliary wire AL together with the contact members 190a, 190b, 190c, and 190d. In FIG. 10, a shaded area corresponds to a region where the auxiliary wire AL may be formed. The auxiliary wire AL may be disposed apart from the contact members 190a, 190b, 190c, and 190d in a region where the contact members 190a, 190b, 190c, and 190d are not formed, for example, FIG. 12 illustrates auxiliary wire AL disposed apart from contact member 190d in a region where contact member 190d is not formed. The auxiliary wire AL may be separated from the contact members 190a, 190b, 190c, and 190d. The auxiliary wire AL may be formed in a same layer by using a same process as those of the contact members 190a, 190b, 190c, and 190d.

The auxiliary wire AL may be continuously formed across groups of the pixels PX1, PX2, and PX3. The auxiliary wire AL may be formed separately for each group of the pixels PX1, PX2, and PX3 or for each of the pixels PX1, PX2, and PX3. The auxiliary wire AL may include a portion overlapping the common voltage line 170, a portion overlapping the driving voltage lines 172a, 172b, and 172c, as illustrated in FIG. 11 and a portion overlapping the data lines 171a, 171b, and 171c. The auxiliary wire AL may be connected to the driving voltage lines 172a, 172b, and 172c through a contact hole 80' of the third insulating layer 181. FIG. 11 illustrates the auxiliary wire AL connected to the driving voltage line 172a through a contact hole 80' of the third insulating layer 181. Although not illustrated, the auxiliary wire AL may be connected to the common voltage line 170 through a contact hole formed in the third insulating layer 181. In the region of one group of pixels PX1, PX2, and PX3, the auxiliary wire AL is separated into at least two portions, a first one of which may be electrically connected to driving voltage lines (e.g., 172b and 172c) and a second one may be electrically connected to the common voltage line 170. As described above, the auxiliary wire AL may be electrically connected to the power voltage lines such as the driving voltage lines 172a, 172b, and 172c and the common voltage line 170 to reduce the resistance of the power voltage lines and voltage drops of power voltages transferred through the power voltage lines.

Figure 13:
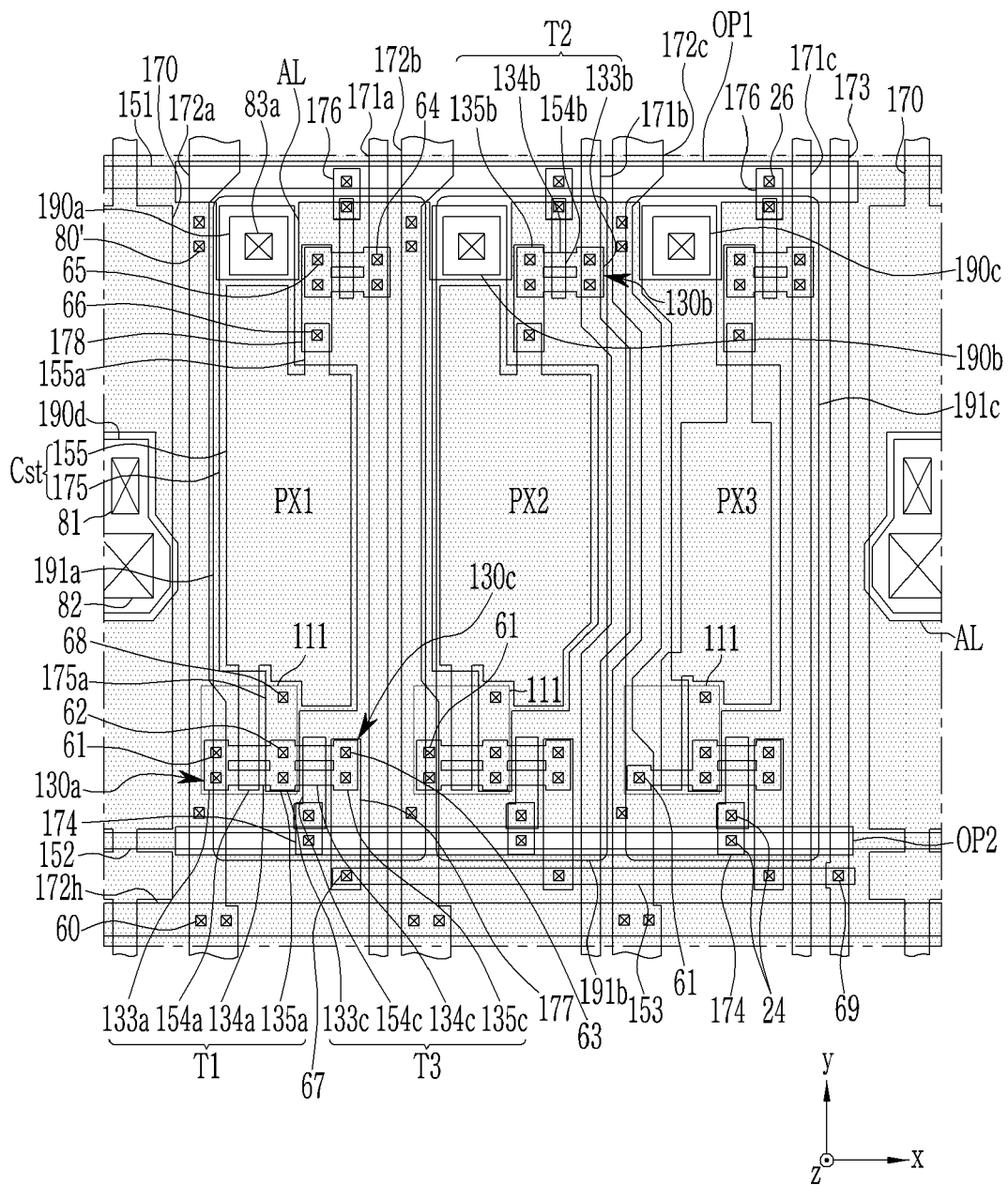
FIG. 13 illustrates a layout view of a pixel area of a display device according to an embodiment.

Referring to FIG. 13, the auxiliary wire AL may be formed to not overlap at least a portion of the first scan line 151 in order to reduce the capacitance that may be formed between the auxiliary wire AL and the first scan line 151. For similar reasons, the auxiliary wire AL may be formed to not overlap at least a portion of the second scan line 152. The auxiliary wire AL may have an opening OP1 overlapping the first scan line 151 and/or an opening OP2 overlapping the second scan line 152.

Figure 14:
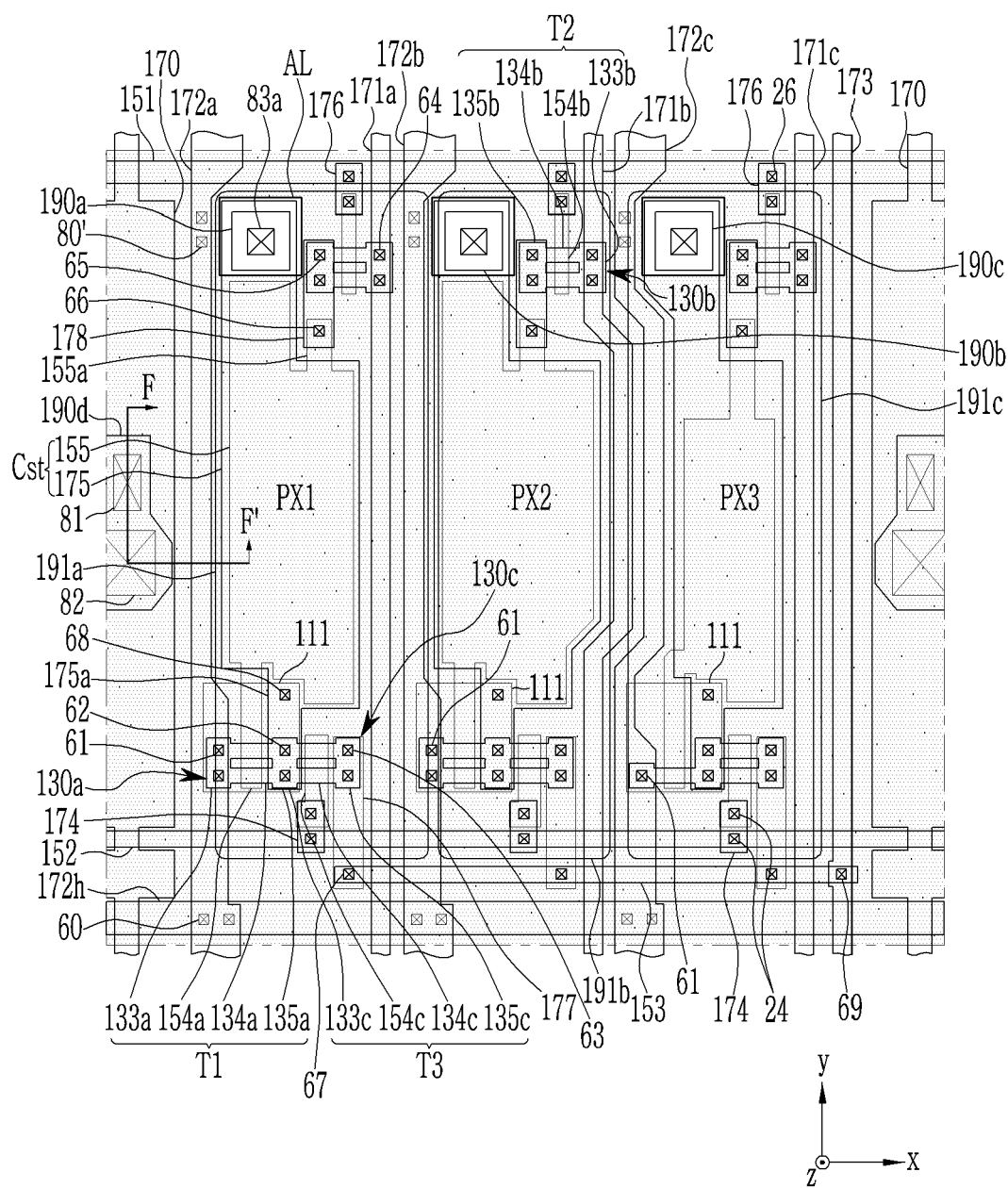
FIG. 14 illustrates a layout view of a pixel area of a display device according to an embodiment.
Figure 15:
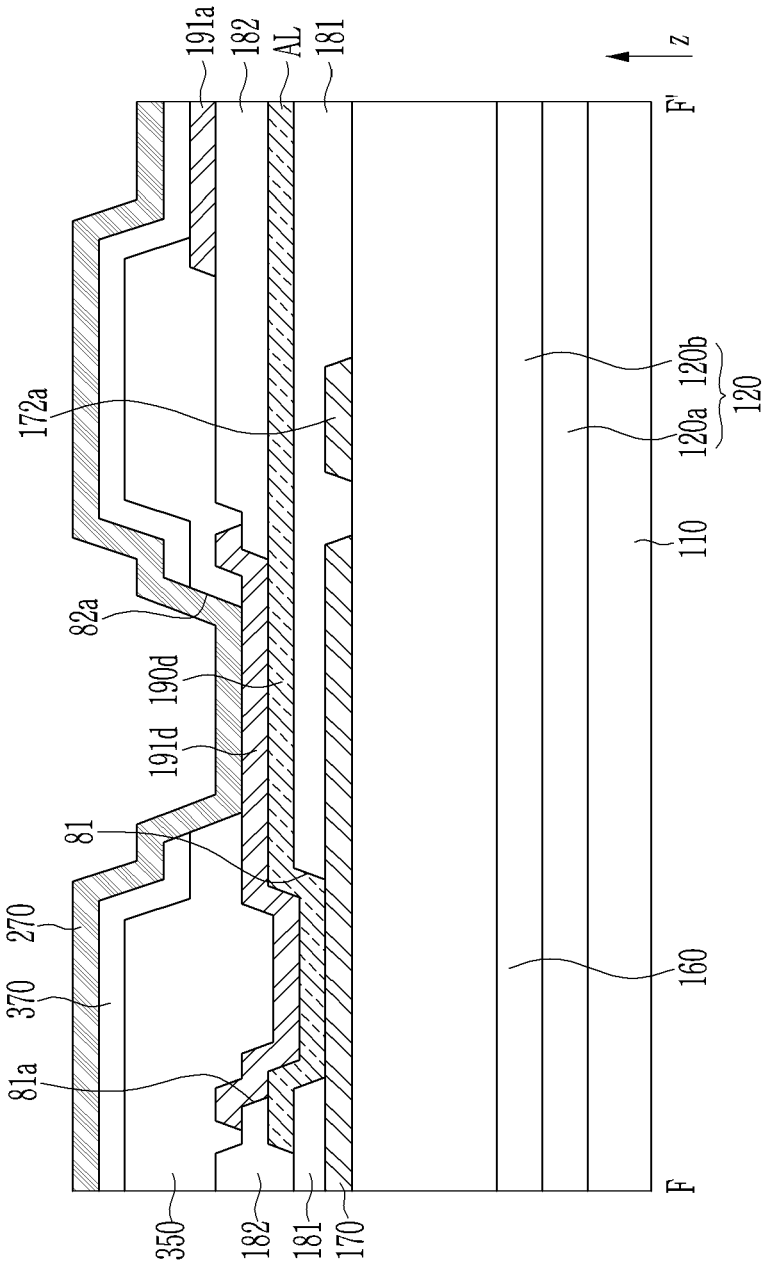
FIG. 15 illustrates a schematic cross-sectional view taken along line F-F' of FIG. 14 according to an embodiment.

FIG. 14 illustrates a layout view of a pixel area of a display device according to an embodiment, and FIG. 15 illustrates a schematic cross-sectional view taken along line F-F' of FIG. 14 according to an embodiment.

Referring to FIG. 14 and FIG. 15, the fourth conductive layer includes an auxiliary wire AL together with the contact members 190a, 190b, 190c, and 190d in the embodiment, similar to the embodiment of FIG. 10 to FIG. 12. In FIG. 14, a shaded portion corresponds to the auxiliary wire AL. The auxiliary wire AL may be separated and spaced apart from the contact members 190a, 190b, and 190c, but may be connected to and continuously formed with the contact member 190d. Since the contact member 190d is connected to the common voltage line 170 through the contact hole 81, the auxiliary wire AL may be electrically connected to the common voltage line 170. Since the auxiliary wire AL may transfer the common voltage ELVSS together with the common voltage line 170, the voltage drop of the common voltage ELVSS may be reduced.

The auxiliary wire AL may be continuously formed across groups of the pixels PX1, PX2, and PX3, but the auxiliary wire AL may be formed separately for each group of the pixels PX1, PX2, and PX3 or for each of the pixels PX1, PX2, and PX3.

The auxiliary wire AL may be connected to the driving voltage lines 172a, 172b, and 172c through the contact hole 80' of the third insulating layer 181. The auxiliary wire AL may be connected to the common voltage line 170 through a contact hole 81 formed in the third insulating layer 181 as illustrated in FIG. 15. In the region of one group of pixels PX1, PX2, and PX3, the auxiliary wire AL may be separated into at least two portions, a first one of which may be electrically connected to the common voltage line 170 and a second one may be electrically connected to driving voltage lines (e.g., 172b and 172c).

Figure 16:
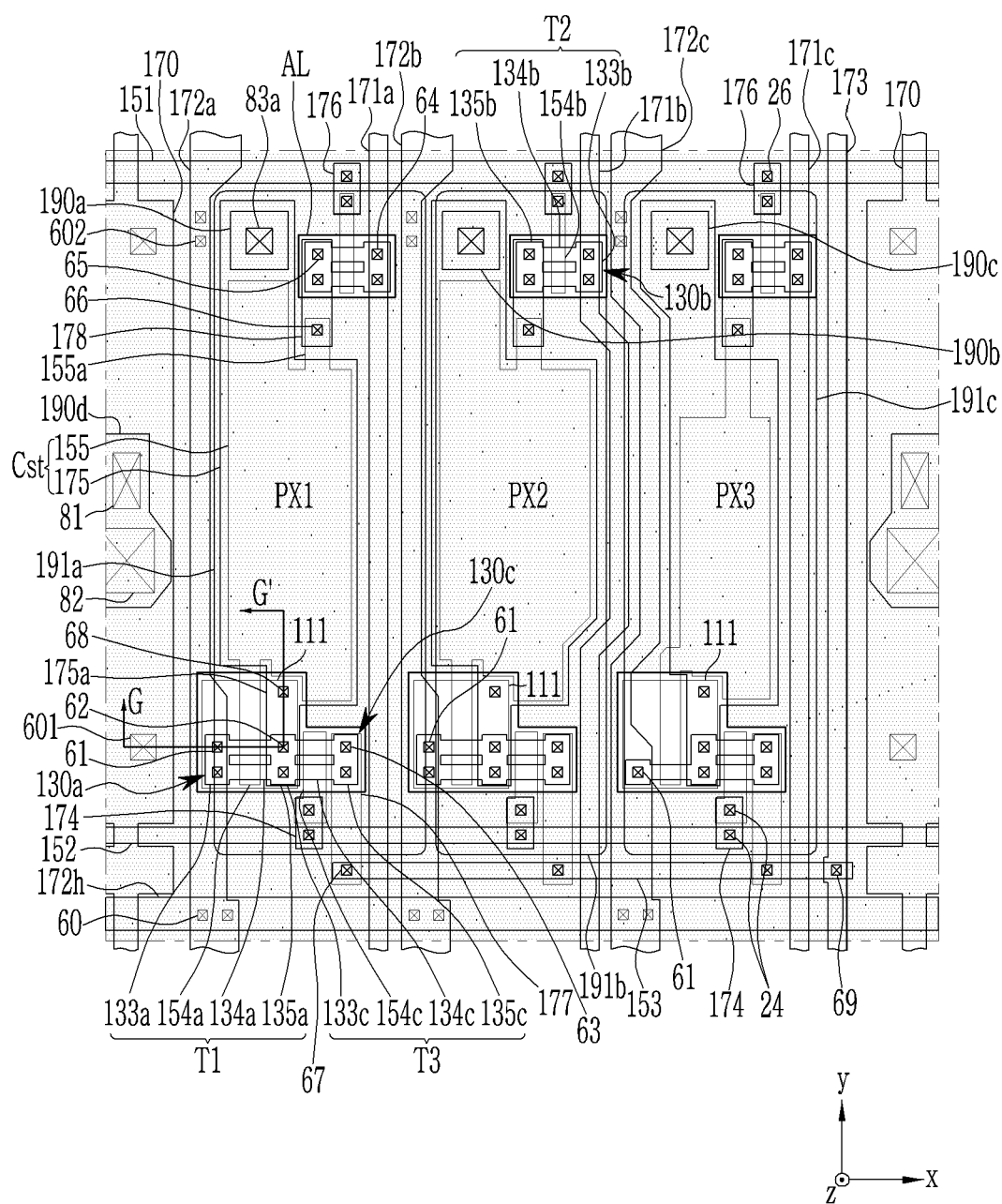
FIG. 16 illustrates a layout view of a pixel area of a display device according to an embodiment.
Figure 17:
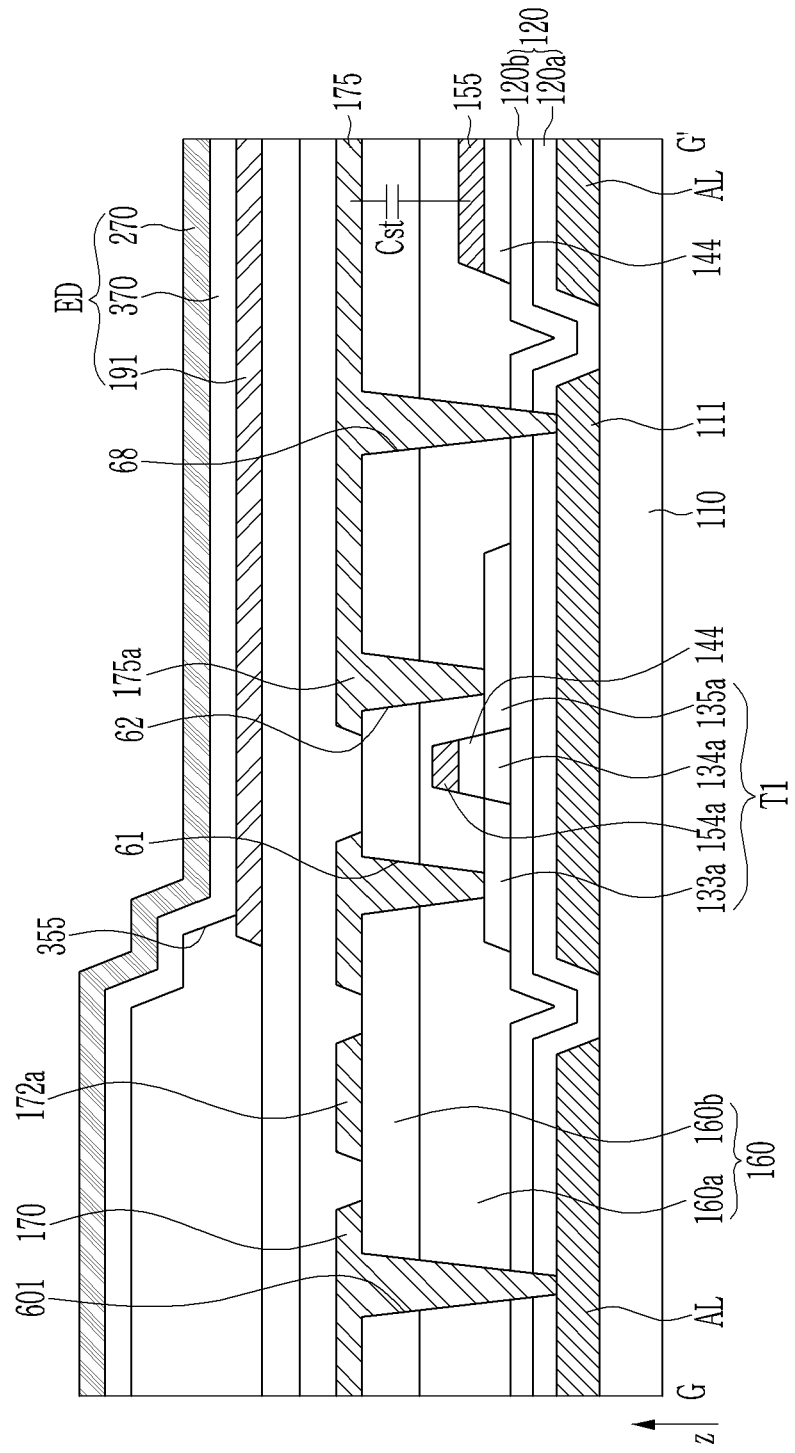
FIG. 17 illustrates a schematic cross-sectional view taken along line G-G' of FIG. 16 according to an embodiment.

FIG. 16 illustrates a layout view of a pixel area of a display device according to an embodiment, and FIG. 17 illustrates a schematic cross-sectional view taken along line G-G' of FIG. 16 according to an embodiment.

Referring to FIG. 16 and FIG. 17, the display device may include an auxiliary wire AL disposed between the substrate 110 and the buffer layer 120. For example, the first conductive layer may include the auxiliary wire AL together with the lower pattern 111, and the auxiliary wire AL may be formed in a same layer by using a same process as that of the lower pattern 111. In FIG. 16, a shaded area corresponds to a region where the auxiliary wire AL may be formed.

The auxiliary wire AL may be separated from the lower pattern 111 and spaced apart therefrom as illustrated in FIG. 17. Since the lower pattern 111 overlaps the active pattern 130a, the auxiliary wire AL does not overlap the active pattern 130a. The auxiliary wire AL may not overlap the active patterns 130b and 130c as well as the active pattern 130a in order to prevent a back bias effect.

The driving voltage lines 172a, 172b, and 172c may be connected to the auxiliary wire AL through a contact hole 602 formed in the second insulating layer 160 and the buffer layer 120. Accordingly, the auxiliary wire AL may reduce the resistance of a wire for transferring the driving voltage ELVDD and the voltage drop of the driving voltage ELVDD.

Figure 18:
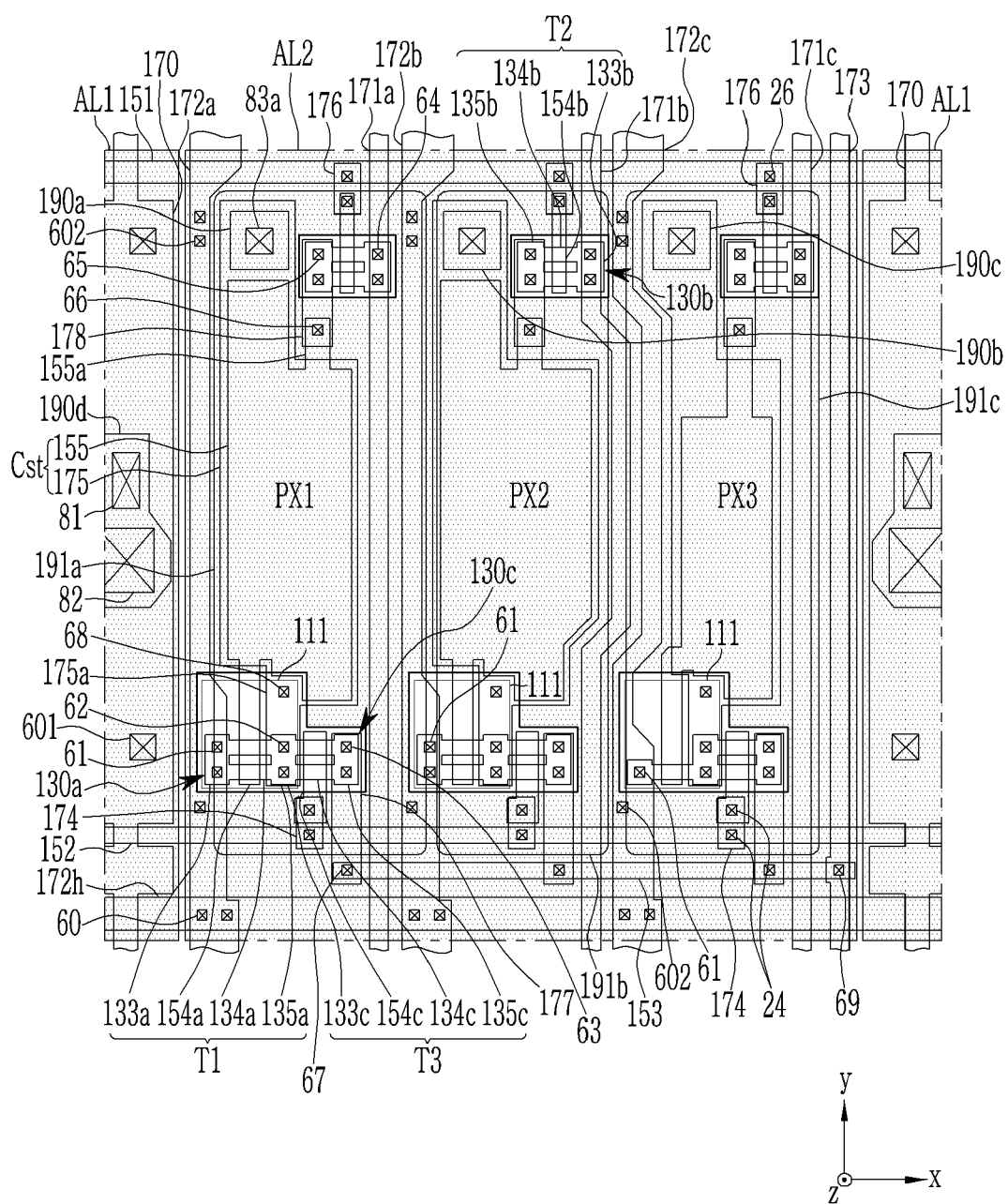
FIG. 18 illustrates a layout view of a pixel area of a display device according to an embodiment.

The common voltage line 170 may be connected to the auxiliary wire AL through the contact hole 601 formed in the second insulating layer 160 and the buffer layer 120 as illustrated in FIG. 17. As illustrated in FIG. 18, the auxiliary wire AL may be separated into at least two portions AL1 and AL2 such that the common voltage line 170 may be connected to a first portion AL1 through the contact hole 601 formed in the second insulating layer 160 and the buffer layer 120, and the driving voltage lines 172a, 172b, and 172c may be connected to a second portion AL2 through a contact hole 602 formed in the second insulating layer 160 and the buffer layer 120. In FIG. 18, a shaded area corresponds to a region where the auxiliary wire AL may be formed.

The auxiliary wire AL may be formed to occupy a wide portion in the pixel region, whereby an undesired capacitor may be formed between the auxiliary wire AL and another wire. A thicker insulating layer may be formed on the auxiliary wire AL in order to reduce the capacitance of such a capacitor. To this end, the buffer layer 120 may be formed of multiple layers including at least a first layer 120a and a second layer 120b. The first layer 120a and/or the second layer 120b may include an organic insulating material or an inorganic insulating material. Similarly, the second insulating layer 160 may be formed of multiple layers including at least a first layer 160a and a second layer 160b, and the first layer 160a and/or the second layer 160b may include an organic insulating material or an inorganic insulating material. Increasing the thickness of the insulating layer in order to reduce the capacitance between the auxiliary wire AL and other wires in this way may be equally applied to the other embodiments described above.

In the above embodiments, the auxiliary wires AL, ALa, ALb, and ALc may be connected to the driving voltage transfer line DVL and/or the common voltage transfer line CVL in the non-display area NA illustrated in FIG. 1. Although the auxiliary wires AL, ALa, ALb, and ALc are described as being electrically connected to a power voltage line such as the driving voltage lines 172a, 172b, and 172c or the common voltage line 170, the auxiliary wires AL, ALa, ALb, and ALc may be electrically connected to wires other than the power voltage line. For example, some of the auxiliary wires AL, ALa, ALb, and ALc may be electrically connected to the data lines 171a, 171b, and 171c, thereby contributing to reducing the delay of the data signal.

While the invention has been illustrated and described with reference to the embodiments thereof, it will be apparent to those of ordinary skill in the art that various changes in form and detail may be formed thereto without departing from the spirit and scope of the invention.

What is claimed is:

1. A display device comprising:
   a substrate including a display area and a non-display area around the display area;
   a transistor disposed on and over the substrate;
   a first insulating layer disposed on and over an active pattern of the transistor;
   a second insulating layer disposed on and over the first insulating layer;
   a power voltage line disposed on and over the second insulating layer, the power voltage line transferring a power voltage;
   a data line disposed on and over the second insulating layer, the data line transferring a data voltage; and
   an auxiliary wire disposed between the first insulating layer and the second insulating layer in the display area, the auxiliary wire including a portion overlapping the power voltage line and a portion overlapping the data line in a plan view, the auxiliary wire being electrically connected to the power voltage line;
   wherein the power voltage line is a driving voltage line that transfers a driving voltage or a common voltage line that transfers a common voltage; and
   wherein the driving voltage line is connected to a source region or a drain region of the transistor through a contact hole formed in the second insulating layer, and to the auxiliary wire through another contact hole formed in the second insulating layer.

2. The display device of claim 1, further comprising a pixel electrode electrically connected to the transistor, wherein
   the auxiliary wire includes a portion overlapping the pixel electrode in the plan view.

3. The display device of claim 2, wherein the auxiliary wire includes a portion overlapping the driving voltage line and a portion overlapping the common voltage line in the plan view.

4. The display device of claim 1, wherein the driving voltage line and the common voltage line are both disposed directly on the second insulating layer.

5. The display device of claim 1, wherein the driving voltage line and the data line are both disposed directly on the second insulating layer.

6. The display device of claim 1, wherein
   the driving voltage line is of integral single-piece form and extends from the non-display area into the display area, and
   the common voltage line is of integral single-piece form and extends from the non-display area into the display area.

7. A display device comprising:
   a substrate including a display area and a non-display area around the display area;
   a transistor disposed on the substrate;
   an insulating layer disposed on the transistor;
   a connection pattern disposed between the insulating layer and the transistor,
   a power voltage line disposed on the insulating layer, the power voltage line transferring a power voltage;
   a data line disposed on the insulating layer, the data line transferring a data voltage; and
   an auxiliary wire disposed between the substrate and the power voltage line in the display area, the auxiliary wire including a portion overlapping the power voltage line and a portion overlapping the data line in a plan view, the auxiliary wire being electrically connected to the power voltage line, wherein
   the connection pattern is electrically connected to the power voltage line and a source region or a drain region of the transistor, and
   the auxiliary wire is disposed on a same layer as the connection pattern.

8. A display device comprising:
   a substrate including a display area and a non-display area around the display area;
   a transistor disposed on and over the substrate;

an insulating layer disposed on and over the transistor;

a power voltage line disposed on and over the insulating layer, the power voltage line being a common voltage line that transfers a common voltage;

a data line disposed on and over the insulating layer, the data line transferring a data voltage;

a pixel electrode on and over the power voltage line; and an auxiliary wire disposed between the substrate and the power voltage line in the display area, the auxiliary wire including a portion overlapping the power voltage line and a portion overlapping the data line in a plan view, the auxiliary wire being electrically connected to the power voltage line, wherein the power voltage line is of integral single-piece form and extends from the non-display area into the display area.

9. The display device of claim 8, wherein the data line and the power voltage line are disposed directly on a same layer.

10. The display device of claim 8, wherein the common voltage line is of integral single-piece form and extends from the non-display area into the display area.

\* \* \* \* \*